(12) United States Patent
Salcedo et al.

(10) Patent No.: US 8,947,841 B2
(45) Date of Patent: Feb. 3, 2015

(54) PROTECTION SYSTEMS FOR INTEGRATED CIRCUITS AND METHODS OF FORMING THE SAME

(75) Inventors: Javier A Salcedo, North Billerica, MA (US); David J. Clarke, Patrickswell (IE); Gavin P. Cosgrave, Enniscorthy (IE); Yuhong Huang, Mountain View, CA (US)

(73) Assignee: Analog Devices, Inc., Norwood, MA (US)

( * ) Notice: Subject to any disclaimer, the term of this patent is extended or adjusted under 35 U.S.C. 154(b) by 291 days.

(21) Appl. No.: 13/372,327

(22) Filed: Feb. 13, 2012

(65) Prior Publication Data
US 2013/0208385 A1    Aug. 15, 2013

(51) Int. Cl.
*H02H 9/00* (2006.01)
*H02H 3/20* (2006.01)
*H02H 9/04* (2006.01)
*H02H 3/22* (2006.01)

(52) U.S. Cl.
USPC .............................. 361/56; 361/91.1; 361/111

(58) Field of Classification Search
CPC ............................... H02H 3/207; H02H 9/046
USPC ............................ 361/56, 91.1, 111, 118, 119
See application file for complete search history.

(56) References Cited

U.S. PATENT DOCUMENTS

| | | | |
|---|---|---|---|
| 3,436,667 A | 4/1969 | Kedson | |
| 4,633,283 A * | 12/1986 | Avery | 257/122 |
| 5,061,652 A | 10/1991 | Bendernagel et al. | |
| 5,276,582 A | 1/1994 | Merrill et al. | |
| 5,341,005 A | 8/1994 | Canclini | |

(Continued)

FOREIGN PATENT DOCUMENTS

| | | |
|---|---|---|
| DE | 10 2007 040 875 A1 | 3/2009 |
| EP | 0 168 678 A2 | 1/1986 |

(Continued)

OTHER PUBLICATIONS

Chang et al., High-k Metal Gate-bounded Silicon Controlled Rectifier for ESD Protection, 34th Electrical Overstress/Electrostatic Discharge Symposium, Sep. 2012, 7 pages.
Anderson et al., *ESD Protection under Wire Bonding Pads*, EOS/ESD Symposium 99-88, pp. 2A.4.1-2A.4.7 (1999).
Luh et al. *A Zener-Diode-Activated ESD Protection Circuit for Sub-Micron CMOS Processes*, Circuits and Systems, IEEE International Symposium, May 28-31, 2000, Geneva, Switzerland, 4 pages.

(Continued)

*Primary Examiner* — Jared Fureman
*Assistant Examiner* — Christopher Clark
(74) *Attorney, Agent, or Firm* — Knobbe, Martens, Olson & Bear, LLP

(57) ABSTRACT

Harsh electrical environments integrated circuit protection for system-level robustness and methods of forming the same are provided. In one embodiment, a protection system includes dual-polarity high blocking voltage primary and secondary protection devices each electrically connected to a pad. The primary protection device has a current handling capability greater than a current handling capability of the secondary protection devices, and the secondary protection device has a turn-on speed that is faster than a turn-on speed of the primary protection device so as to decrease pad voltage overshoot when a fast transient electrical event occurs on the pad. Additionally, the holding voltage of the primary protection device is less than a holding voltage of the secondary protection device such that once the primary protection device has been activated the primary protection device clamps the pad voltage so as to minimize a flow of high current through the secondary protection device.

24 Claims, 16 Drawing Sheets

(56) References Cited

U.S. PATENT DOCUMENTS

| | | | |
|---|---|---|---|
| 5,343,053 A | 8/1994 | Avery | |
| 5,541,801 A * | 7/1996 | Lee et al. | 361/56 |
| 5,576,557 A | 11/1996 | Ker et al. | |
| 5,615,074 A * | 3/1997 | Avery | 361/56 |
| 5,652,689 A | 7/1997 | Yuan | |
| 5,663,860 A | 9/1997 | Swonger | |
| 5,742,084 A | 4/1998 | Yu | |
| 5,745,323 A | 4/1998 | English et al. | |
| 5,781,389 A | 7/1998 | Fukuzako et al. | |
| 5,786,617 A | 7/1998 | Merrill et al. | |
| 5,889,644 A | 3/1999 | Schoenfeld et al. | |
| 5,895,840 A | 4/1999 | Ohuchi et al. | |
| 5,895,940 A | 4/1999 | Kim | |
| 5,998,813 A | 12/1999 | Bernier | |
| 6,137,140 A | 10/2000 | Efland et al. | |
| 6,144,542 A * | 11/2000 | Ker et al. | 361/111 |
| 6,236,087 B1 | 5/2001 | Daly et al. | |
| 6,258,634 B1 | 7/2001 | Wang et al. | |
| 6,310,379 B1 | 10/2001 | Andresen et al. | |
| 6,329,694 B1 | 12/2001 | Lee et al. | |
| 6,403,992 B1 | 6/2002 | Wei | |
| 6,404,261 B1 | 6/2002 | Grover et al. | |
| 6,423,987 B1 | 7/2002 | Constapel et al. | |
| 6,512,662 B1 * | 1/2003 | Wang | 361/56 |
| 6,590,273 B2 | 7/2003 | Okawa et al. | |
| 6,621,126 B2 * | 9/2003 | Russ | 257/355 |
| 6,665,160 B2 | 12/2003 | Lin et al. | |
| 6,667,870 B1 | 12/2003 | Segervall | |
| 6,704,180 B2 | 3/2004 | Tyler et al. | |
| 6,724,603 B2 | 4/2004 | Miller et al. | |
| 6,756,834 B1 | 6/2004 | Tong et al. | |
| 6,765,771 B2 | 7/2004 | Ker et al. | |
| 6,768,616 B2 | 7/2004 | Mergens et al. | |
| 6,870,202 B2 | 3/2005 | Oka | |
| 6,960,792 B1 | 11/2005 | Nguyen | |
| 6,960,811 B2 | 11/2005 | Wu et al. | |
| 6,979,869 B2 | 12/2005 | Chen et al. | |
| 7,034,363 B2 * | 4/2006 | Chen | 257/355 |
| 7,038,280 B2 | 5/2006 | Righter | |
| 7,071,528 B2 | 7/2006 | Ker et al. | |
| 7,125,760 B1 * | 10/2006 | Reese et al. | 438/154 |
| 7,232,705 B2 | 6/2007 | Righter | |
| 7,232,711 B2 | 6/2007 | Gambino et al. | |
| 7,335,543 B2 | 2/2008 | Chen et al. | |
| 7,345,341 B2 | 3/2008 | Lin et al. | |
| 7,385,793 B1 | 6/2008 | Ansel et al. | |
| 7,436,640 B2 | 10/2008 | Su et al. | |
| 7,566,914 B2 | 7/2009 | Salcedo et al. | |
| 7,570,467 B2 | 8/2009 | Watanabe et al. | |
| 7,601,991 B2 * | 10/2009 | Salcedo et al. | 257/173 |
| 7,663,190 B2 | 2/2010 | Vinson | |
| 7,714,357 B2 | 5/2010 | Hayashi et al. | |
| 7,834,378 B2 * | 11/2010 | Ryu et al. | 257/173 |
| 7,910,999 B2 | 3/2011 | Lee et al. | |
| 7,969,006 B2 | 6/2011 | Lin et al. | |
| 8,044,457 B2 | 10/2011 | Salcedo et al. | |
| 8,198,651 B2 | 6/2012 | Langguth et al. | |
| 8,222,698 B2 | 7/2012 | Salcedo et al. | |
| 8,331,069 B2 * | 12/2012 | Galy et al. | 361/56 |
| 8,368,116 B2 | 2/2013 | Salcedo et al. | |
| 8,416,543 B2 | 4/2013 | Salcedo | |
| 8,432,651 B2 | 4/2013 | Salcedo et al. | |
| 8,466,489 B2 * | 6/2013 | Salcedo et al. | 257/120 |
| 8,553,380 B2 | 10/2013 | Salcedo | |
| 8,592,860 B2 * | 11/2013 | Salcedo et al. | 257/140 |
| 8,610,251 B1 | 12/2013 | Salcedo | |
| 8,633,509 B2 | 1/2014 | Salcedo et al. | |
| 8,637,899 B2 | 1/2014 | Salcedo | |
| 8,665,571 B2 * | 3/2014 | Salcedo et al. | 361/56 |
| 8,680,620 B2 | 3/2014 | Salcedo et al. | |
| 8,772,091 B2 | 7/2014 | Salcedo et al. | |
| 8,796,729 B2 | 8/2014 | Clarke et al. | |
| 2001/0040254 A1 | 11/2001 | Takiguchi | |
| 2002/0021538 A1 | 2/2002 | Chen et al. | |
| 2002/0081783 A1 | 6/2002 | Lee et al. | |
| 2002/0109190 A1 | 8/2002 | Ker et al. | |
| 2002/0122280 A1 | 9/2002 | Ker et al. | |
| 2002/0187601 A1 | 12/2002 | Lee et al. | |
| 2003/0038298 A1 | 2/2003 | Cheng et al. | |
| 2003/0076636 A1 | 4/2003 | Ker et al. | |
| 2004/0135229 A1 | 7/2004 | Sasahara | |
| 2004/0164354 A1 | 8/2004 | Mergens et al. | |
| 2004/0190208 A1 | 9/2004 | Levit | |
| 2004/0207021 A1 | 10/2004 | Russ et al. | |
| 2004/0240128 A1 | 12/2004 | Boselli et al. | |
| 2005/0012155 A1 | 1/2005 | Ker et al. | |
| 2005/0082618 A1 | 4/2005 | Wu et al. | |
| 2005/0087807 A1 | 4/2005 | Righter | |
| 2005/0088794 A1 | 4/2005 | Boerstler et al. | |
| 2005/0093069 A1 | 5/2005 | Logie | |
| 2005/0151160 A1 * | 7/2005 | Salcedo et al. | 257/173 |
| 2005/0195540 A1 | 9/2005 | Streibl et al. | |
| 2006/0033163 A1 | 2/2006 | Chen | |
| 2006/0109595 A1 | 5/2006 | Watanabe et al. | |
| 2006/0145260 A1 | 7/2006 | Kim | |
| 2006/0186467 A1 | 8/2006 | Pendharkar et al. | |
| 2007/0007545 A1 | 1/2007 | Salcedo et al. | |
| 2007/0058307 A1 * | 3/2007 | Mergens et al. | 361/56 |
| 2007/0158748 A1 | 7/2007 | Chu et al. | |
| 2008/0044955 A1 | 2/2008 | Salcedo et al. | |
| 2008/0067601 A1 | 3/2008 | Chen | |
| 2009/0032838 A1 | 2/2009 | Tseng et al. | |
| 2009/0034137 A1 | 2/2009 | Disney et al. | |
| 2009/0045457 A1 | 2/2009 | Bobde | |
| 2009/0057715 A1 | 3/2009 | Ryu et al. | |
| 2009/0206376 A1 | 8/2009 | Mita et al. | |
| 2009/0230426 A1 | 9/2009 | Carpenter et al. | |
| 2009/0236631 A1 | 9/2009 | Chen et al. | |
| 2009/0309128 A1 | 12/2009 | Salcedo et al. | |
| 2010/0133583 A1 | 6/2010 | Mawatari et al. | |
| 2010/0163973 A1 * | 7/2010 | Nakamura et al. | 257/328 |
| 2010/0327343 A1 * | 12/2010 | Salcedo et al. | 257/328 |
| 2011/0101444 A1 | 5/2011 | Coyne et al. | |
| 2011/0110004 A1 * | 5/2011 | Maier | 361/56 |
| 2011/0176244 A1 | 7/2011 | Gendron et al. | |
| 2011/0284922 A1 | 11/2011 | Salcedo et al. | |
| 2011/0303947 A1 | 12/2011 | Salcedo et al. | |
| 2011/0304944 A1 * | 12/2011 | Salcedo et al. | 361/111 |
| 2012/0007207 A1 | 1/2012 | Salcedo | |
| 2012/0008242 A1 * | 1/2012 | Salcedo | 361/56 |
| 2012/0199874 A1 | 8/2012 | Salcedo et al. | |
| 2012/0205714 A1 | 8/2012 | Salcedo et al. | |
| 2012/0293904 A1 | 11/2012 | Salcedo et al. | |
| 2013/0032882 A1 | 2/2013 | Salcedo et al. | |
| 2013/0208385 A1 | 8/2013 | Salcedo et al. | |
| 2013/0234209 A1 | 9/2013 | Parthasarathy et al. | |
| 2013/0242448 A1 | 9/2013 | Salcedo | |
| 2013/0270605 A1 * | 10/2013 | Salcedo et al. | 257/120 |
| 2013/0330884 A1 | 12/2013 | Salcedo et al. | |
| 2014/0138735 A1 | 5/2014 | Clarke et al. | |
| 2014/0167104 A1 | 6/2014 | Salcedo | |
| 2014/0167105 A1 | 6/2014 | Salcedo et al. | |
| 2014/0167106 A1 | 6/2014 | Salcedo | |

FOREIGN PATENT DOCUMENTS

| | | |
|---|---|---|
| EP | 1 703 560 A2 | 9/2006 |
| KR | 10-2006-0067100 | 2/2006 |
| KR | 10-2009-0123683 | 12/2009 |
| KR | 10-2010-0003569 | 1/2010 |

OTHER PUBLICATIONS

Salcedo et al., *Electrostatic Discharge Protection Framework for Mixed-Signal High Voltage CMOS Applications*, IEEE Xplore, downloaded Feb. 23, 2010 at 12:53 EST.

Salcedo et al., Bidirectional Devices for Automotive-Grade Electrostatic Discharge Applications, IEEE Electron Device Letters, vol. 33, No. 6, Jun. 2012, 3 pages.

Salcedo et al., On-Chip Protection for Automotive Integrated Circuits Robustness, 2012 8th International Caribbean Conference on Devices, Circuits and Systems (ICCDCS), 5 pages, Mar. 2012.

* cited by examiner

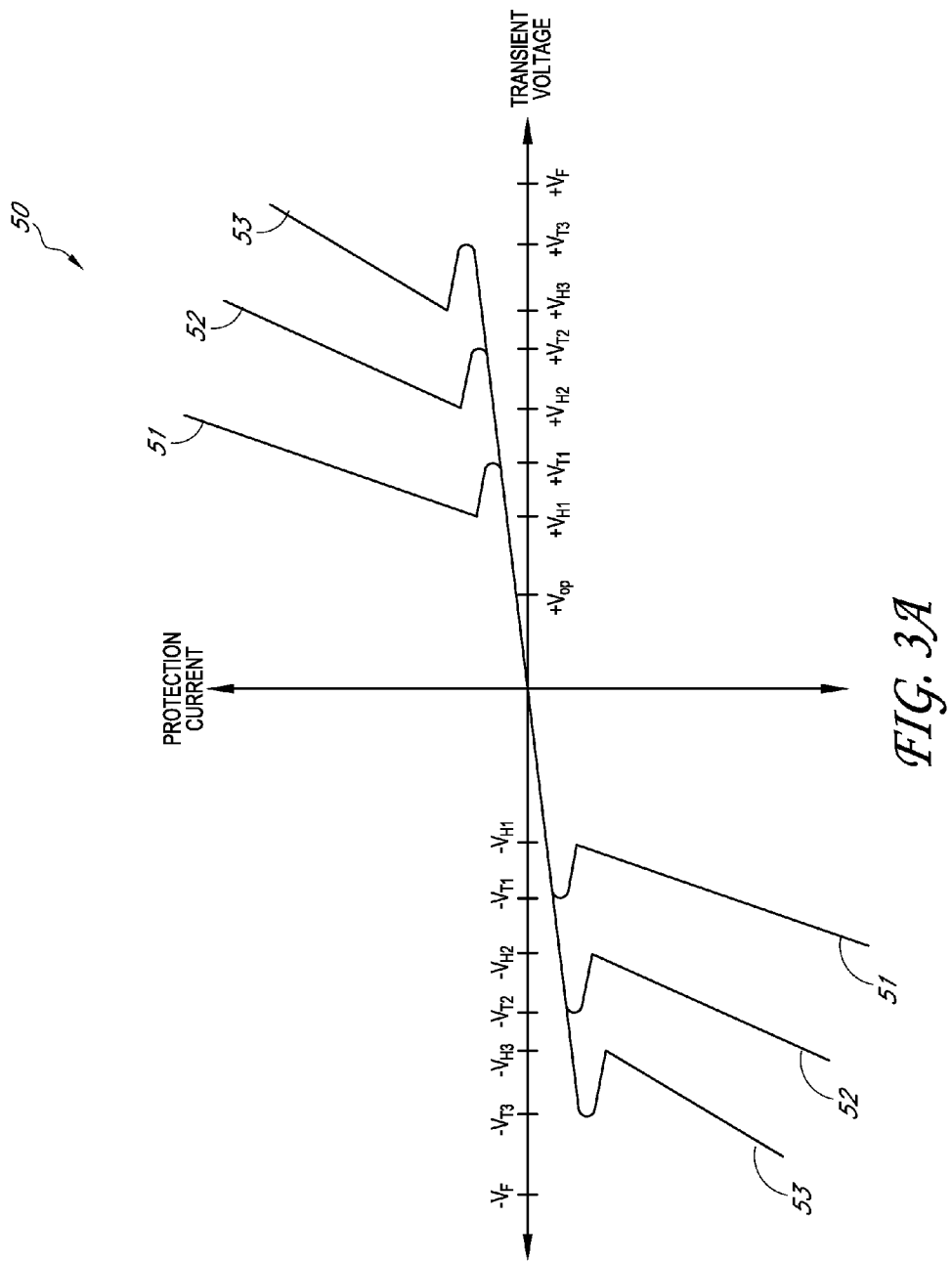

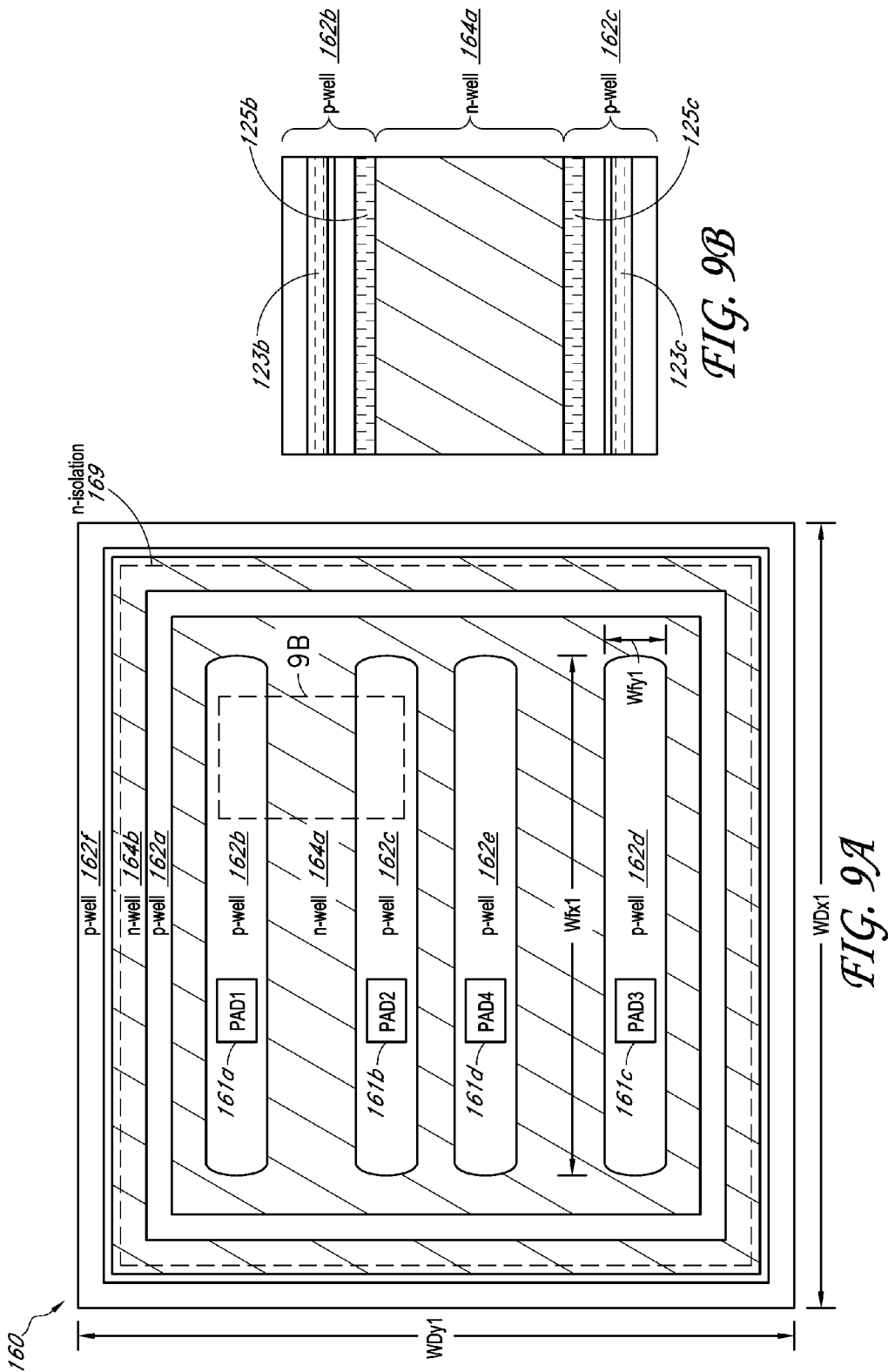

PROTECTION SYSTEMS FOR INTEGRATED CIRCUITS AND METHODS OF FORMING THE SAME

BACKGROUND

1. Field

Embodiments of the invention relate to electronic systems, and more particularly, to protection systems for integrated circuits (ICs).

2. Description of the Related Technology

Certain electronic systems can be exposed to a transient electrical event, or an electrical signal of a relatively short duration having rapidly changing voltage and high power. Transient electrical events can include, for example, electrostatic discharge (ESD) events and/or electromagnetic interference (EMI) events.

Transient electrical events can damage integrated circuits (ICs) inside an electronic system due to overvoltage conditions and/or high levels of power dissipation over relatively small areas of the ICs. High power dissipation can increase IC temperature, and can lead to numerous problems, such as gate oxide punch-through, junction damage, metal damage, and surface charge accumulation. Moreover, transient electrical events can induce latch-up (in other words, inadvertent creation of a low-impedance path), thereby disrupting the functioning of the IC and potentially causing permanent damage to the IC. Thus, there is a need to provide an IC with protection from such transient electrical events, such as during IC power-up and power-down conditions.

SUMMARY

In one embodiment, an apparatus includes a first pad, an internal circuit electrically connected to the first pad, and a protection system configured to protect the internal circuit from transient electrical events. The protection system includes a first primary protection device electrically connected to the first pad and configured to have a first holding voltage and to provide bi-directional blocking voltage protection. The protection system further includes a first secondary protection device electrically connected to the first pad and configured to have a second holding voltage and to provide bi-directional blocking voltage protection. The first primary protection device has a current handling capability greater than a current handling capability of the first secondary protection device, and the first secondary protection device is smaller than the first primary protection device and has a turn-on speed that is faster than a turn-on speed of the first primary protection device. A magnitude of the first holding voltage is less than a magnitude of the second holding voltage such that when the first primary protection device has been activated the activated first primary protection device clamps a voltage of the first pad and decreases a flow of current through the first secondary protection device.

In another embodiment, an apparatus includes a pad, an internal circuit electrically connected to the pad, and a protection system configured to protect the internal circuit from transient electrical events. The protection system includes a means for providing bi-directional blocking voltage primary protection electrically connected to the pad and configured to have a first holding voltage. The protection system further includes a means for providing secondary bi-directional blocking voltage protection electrically connected to the pad and configured to have a second holding voltage. The primary protection means has a current handling capability greater than a current handling capability of the secondary protection means, and the secondary protection means has a turn-on speed that is faster than a turn-on speed of the primary protection means. A magnitude of the first holding voltage is less than a magnitude of the second holding voltage such that when the primary bi-directional blocking voltage protection means has been activated the activated primary protection means clamps a voltage of the pad so as to decrease a flow of current through the secondary protection means.

In another embodiment, an apparatus includes a substrate, a pad, a primary protection device electrically connected to the pad and configured to have a first holding voltage, and a secondary protection device electrically connected to the pad and configured to have a second holding voltage. The primary protection device includes a first bi-directional bipolar transistor disposed in the substrate, and the secondary protection device includes a second bi-directional bipolar transistor disposed in the substrate. The primary protection device has a current handling capability greater than a current handling capability of the secondary protection device, and the secondary protection device has a turn-on speed that is faster than a turn-on speed of the primary protection device. A magnitude of the first holding voltage is less than a magnitude of the second holding voltage such that when the primary protection device has been activated the activated primary protection device clamps a voltage of the pad so as to decrease a flow of current through the secondary protection device.

BRIEF DESCRIPTION OF THE DRAWINGS

FIG. 3A is a graph showing a relationship between current and voltage for one example of the primary, secondary, and tertiary protection devices of FIG. 2.

FIG. 9A is a schematic top plan layout view of a protection device according to one embodiment.

FIG. 9B is an enlarged partial top plan layout view of one implementation of the protection device of FIG. 9A.

DETAILED DESCRIPTION OF EMBODIMENTS

Figure 1A:
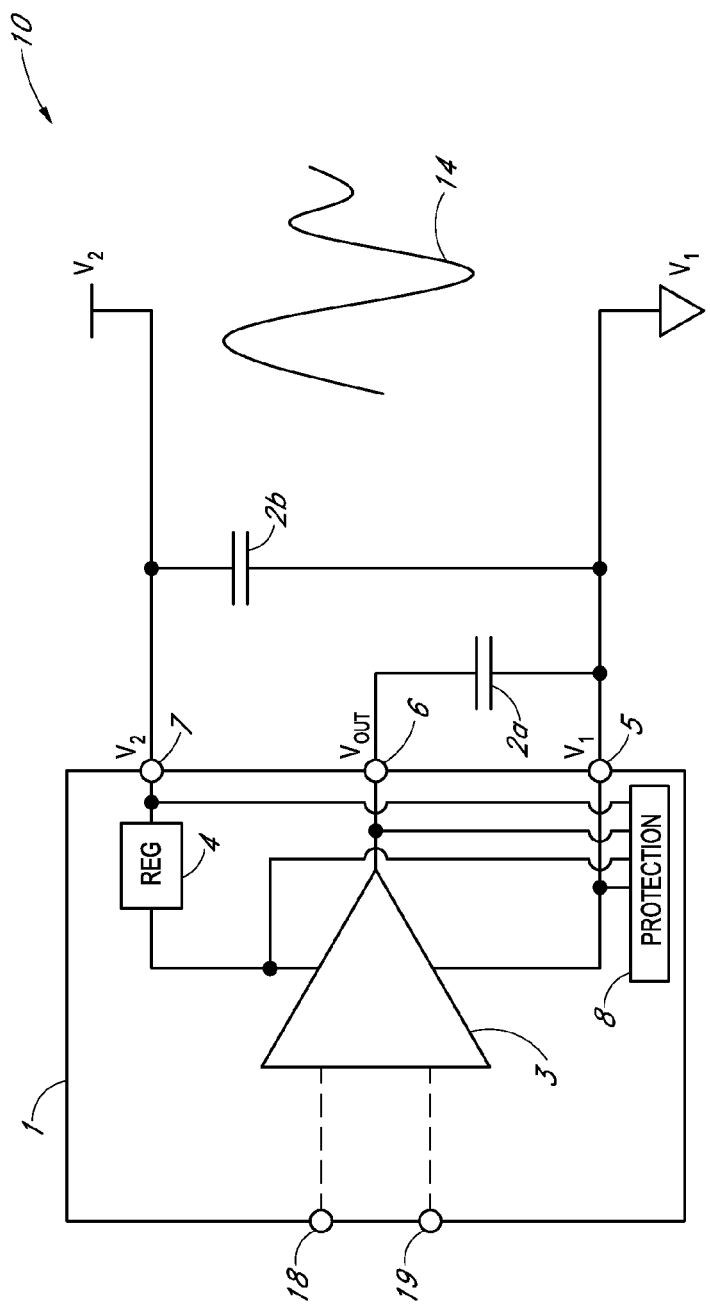
FIG. 1A is a schematic block diagram of an integrated circuit (IC).

The following detailed description of certain embodiments presents various descriptions of specific embodiments of the invention. However, the invention can be embodied in a multitude of different ways as defined and covered by the claims. In this description, reference is made to the drawings where like reference numerals indicate identical or functionally similar elements.

Terms such as above, below, over and so on as used herein refer to a device orientated as shown in the figures and should be construed accordingly. It should also be appreciated that because regions within a semiconductor device (such as a transistor) are defined by doping different parts of a semiconductor material with differing impurities or differing concentrations of impurities, discrete physical boundaries between different regions may not actually exist in the completed device but instead regions may transition from one to another. Some boundaries as shown in the accompanying figures are of this type and are illustrated as abrupt structures merely for the assistance of the reader. In the embodiments described below, p-type regions can include a p-type semiconductor material, such as boron, as a dopant. Further, n-type regions can include an n-type semiconductor material, such as phosphorous, as a dopant. A skilled artisan will appreciate various concentrations of dopants in regions described below.

Certain electronic systems are configured to protect circuits or components therein from transient electrical events. Furthermore, to assure that an electronic system is reliable, manufacturers can test the electronic system under defined stress conditions, which can be described by standards set by various organizations, such as the Joint Electronic Device Engineering Council (JEDEC), the International Electrotechnical Commission (IEC), the Automotive Engineering Council (AEC), and the International Organization for Standardization (ISO). The standards can cover a wide multitude of transient electrical events as discussed above, including electrostatic discharge (ESD) events and/or electromagnetic interference (EMI) events.

Electronic circuit reliability is enhanced by providing protection devices to the pads of an IC. The protection devices can be incorporated on-chip or at a system-level, and can maintain the voltage level at the pads within a predefined safe range by transitioning from a high-impedance state to a low-impedance state when the voltage of the transient signal reaches a trigger voltage. Thereafter, the protection device can shunt at least a portion of the current associated with the transient signal before the voltage of a transient signal reaches a positive or negative failure voltage that can lead to one of the most common causes of IC damage. As will be described in detail later with reference to FIG. 3A, after activation, a protection device can remain in the low-impedance state as long as the transient signal voltage level is above a positive holding voltage or below a negative holding voltage.

An integrated circuit (IC) can include one or more pads exposed to an operational voltage that can range between a negative voltage and a positive voltage. In certain applications, it is desirable to have a protection device that can protect an internal circuit from both negative and positive transient signals that have a voltage magnitude that is outside normal circuit operating conditions. For example, it can be desirable that the protection device protect an internal circuit against transient signals that exceed the IC power-high and power-low (for instance, ground) voltage levels by a certain amount. Using a protection device to provide protection against both positive and negative transient electrical events can permit a reduction in layout area relative to a design that uses separate structures for protection against positive and negative transient signals, thereby enabling a more scalable design solution.

Overview of Electronic Systems with Protection Devices

FIG. 1A is a schematic block diagram of an integrated circuit (IC) 1. The IC 1 is illustrated as being electrically connected to a first capacitor 2a and a second capacitor 2b, and includes an internal circuit 3, a voltage regulator 4, a first or power-low pad 5, a second or signal pad 6, a third or power-high pad 7, a protection block or system 8, a first low-stress pad 18, and a second low-stress pad 19.

The internal circuit 3 can receive power and/or communicate signals over the pads 5-7. In one implementation, the power-low pad 5 is configured to receive a first power supply voltage $V_1$, the signal pad 6 is configured to receive and/or generate a signal voltage $V_{OUT}$, and the power-high pad 7 is configured to receive a second power supply voltage $V_2$. Although one configuration of the pads 5-7 has been described, the IC 1 can be adapted to include more or fewer pads and/or a different arrangement of pads.

The internal circuit 3 can also be electrically connected to the first and second low-stress pads 18, 19 directly or through one or more components. The first and second low-stress pads 18, 19 can be general purpose pads which can be exposed to an electrical environment that is less harsh than the electrical environment that the pads 5-7 are exposed to. For example, the first and second low-stress pads 18, 19 can receive transient electrical events that have a smaller voltage and/or current magnitude relative to transient electrical events received on the pads 5-7. Although FIG. 1A illustrates a configuration including the first and second low-stress pads 18, 19, in certain implementations the first and second low-stress pads 18, 19 can be omitted.

One or more of the pads 5-7 of the IC 1 can be exposed to a transient electrical event 14, which can cause signaling conditions beyond those associated with normal IC operation and can cause IC damage and/or induce latch-up. For example, the transient electrical event 14 can be, for instance, an IC-level ESD event associated with user or machine handling of the IC, such as an ESD event defined by the AEC-Q100 specifications. The transient electrical event 14 can produce overvoltage or undervoltage conditions and can dissipate high levels of power, which can disrupt the functioning of the internal circuit 3 and potentially cause permanent damage. As used herein, an "undervoltage condition" is a negative magnitude overvoltage condition.

To help protect the IC 1 from transient electrical events, the protection system 8 has been included. The protection system 8 can be used to ensure reliability of the IC 1 by maintaining the voltage level at the pads 5-7 of the IC 1 within a particular range of voltage, which can vary from pad to pad. The protection system 8 can be configured to divert a current associated with a transient electrical event received on a pad of the IC to other nodes or pads of the IC, thereby providing transient electrical event protection. In certain implementations, the protection system 8 is electrically connected not only to the pads 5-7 of the IC 1, but to one or more internal nodes of the IC 1 and/or to the first and second low-stress pins 18, 19. For example, the protection system 8 can be electrically connected to an internal voltage supply generated by the voltage regulator 4 so as to protect circuitry that is electrically powered using the voltage regulator 4.

In certain implementations, the first and second capacitors 2a, 2b can be included between certain pads to help protect the pads from transient electrical events. For example, in the illustrated implementation, the first capacitor 2a has been electrically connected between the signal pad 6 and the power-low pad 5, and the second capacitor 2b has been electrically connected between the power-high pad 7 and the power-low pad 5. Although the first and second capacitors 2a, 2b can be included external to the IC 1 to help provide transient electrical event protection, in certain implementations, the first and second capacitors 2a, 2b can be omitted and/or a different arrangement of external components can be provided.

The IC 1 can be used in, for example, local interconnect network (LIN) and controller area network (CAN) protocol systems, transmission line systems, industrial control systems, power management systems, microelectromechanical system (MEMS) sensor systems, transducer systems, or a variety of other systems. The IC 1 can be utilized in electronic systems in which the pads of the IC 1 are exposed to user contact through a low-impedance connection. In one embodiment, the IC 1 is a pressure sensor signal conditioning IC for an automobile.

Figure 1B:
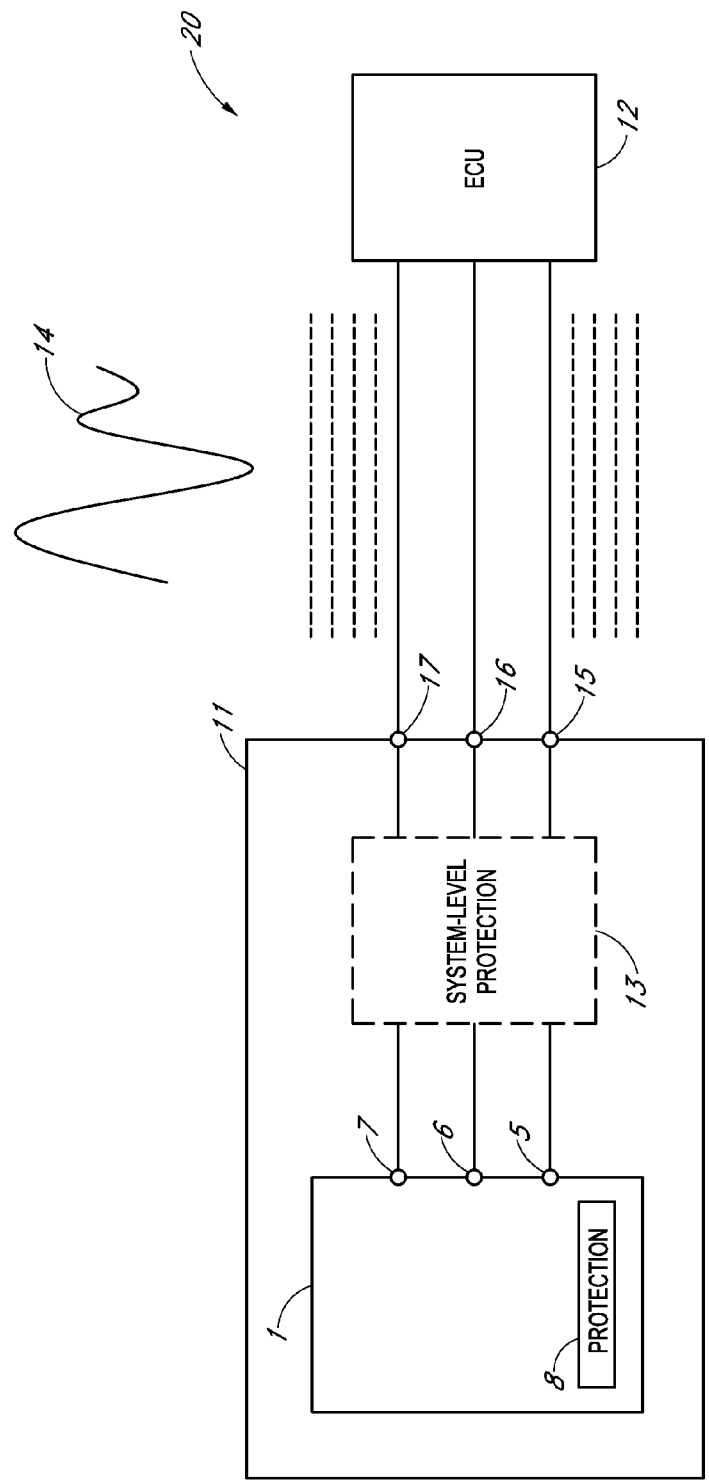
FIG. 1B is a schematic block diagram of an electronic system including an engine control unit (ECU) and a circuit board that includes a system-level protection block and the IC of FIG. 1A.

FIG. 1B is a schematic block diagram of an electronic system 20 including the IC 1 of FIG. 1A. The electronic system 20 includes a circuit board or card 11 and an engine control unit (ECU) 12. The circuit board 11 includes the IC 1, a first pin 15, a second pin 16, and a third pin 17. In certain implementations, the circuit board 11 further includes a system-level protection block 13.

The IC 1 can be electrically connected to the ECU 12 so that power can be provided to the IC 1 and/or signals can be communicated between the IC 1 and the ECU 12. For example, the first to third pads 5-7 of the IC 1 can be electrically connected to the first to third pins 15-17 of the circuit board 11, respectively, which can be electrically connected to the ECU 12 using, for example, wires or cables. In certain implementations, the first pin 15 of the circuit board 11 is a power-low pin, the second pin 16 of the circuit board 11 is a signal pin, and the third pin 17 of the circuit board 11 is a power-high pin. However, other configurations are possible, including, for example, configurations using more or fewer pins.

Transient electrical events can occur in the electronic system 10 that can reach the IC 1. For example, system-level ESD events and/or EMI events associated with inductive coupling of a wire harness used to electrically connect the circuit board 11 and the ECU 12 can result in the generation of a transient electrical event 14.

Conventional electronic systems can include a system-level protection block on a circuit board to protect an IC from system-level transient electrical events. In contrast, in certain implementations described herein, the protection system 8 is configured to provide both IC-level and system-level transient electrical event protection, thereby helping to reduce the size of or to eliminate the system-level protection block 13. For example, the protection system 8 can be configured to protect the IC 1 not only from device-level transient electrical events, such as those defined by the AEC-Q100 standards, but also from system-level transient electrical events, such as those defined by the IEC-61000-4-2 standards. Thus, in contrast to a conventional electronic system that uses a separate protection system for IC-level and system-level protection, in certain embodiments the protection system 8 of the IC 1 is configured to provide full system-level protection or at least a portion of the system-level protection so as to eliminate or reduce the size of the system-level protection block 13 from the circuit board 11.

By reducing the size of or eliminating the system-level protection block 13, the cost of the electronic system 20 is reduced. Additionally, configuring the protection system 8 of the IC 1 to provide both IC-level and system-level protection can increase the robustness of the IC 1, thereby enhancing the range of applications that the IC 1 can be used in and/or the harshness of the electrical environment in which the IC 1 can operate.

Figure 2:
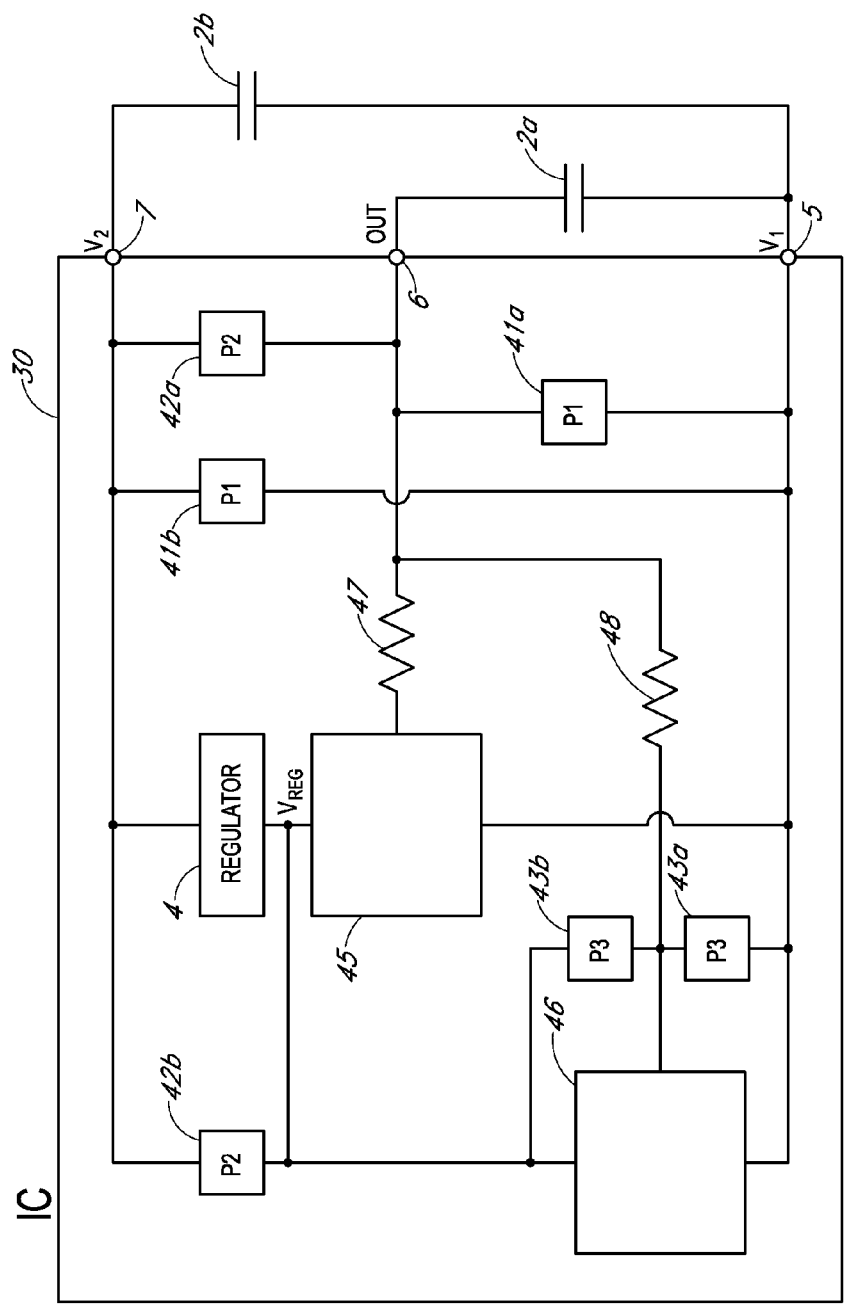
FIG. 2 is a schematic block diagram of one embodiment of an IC.

FIG. 2 is a schematic block diagram of one embodiment of an IC 30. The IC 30 is illustrated as being connected to the first capacitor 2a and the second capacitor 2b, and includes the voltage regulator 4, the first or power-low pad 5, the second or signal pad 6, the third or power-high pad 7, a first primary protection device 41a, a second primary protection device 41b, a first secondary protection device 42a, a second secondary protection device 42b, a first tertiary protection device 43a, a second tertiary protection device 43b, a first internal circuit 45, a second internal circuit 46, a first resistor 47, and a second resistor 48. In the illustrated configuration, the primary protection devices 41a-41b, the secondary protection devices 42a-42b, and the tertiary protection devices 43a-43b operate as a protection system of the IC 30.

The IC 30 includes the first and second internal circuit 45, 46, which can be used for communicating data over an interface. For example, the first and second internal circuits 45, 46 can be configured to generate and/or sense a signal voltage $V_{OUT}$ on the signal pad 6. In the illustrated configuration, the first internal circuit 45 is electrically connected to the signal pin 6 through the first resistor 47, and the second internal circuit 46 is electrically connected to the signal pin 6 through the second resistor 48. Although the IC 30 illustrates a configuration in which two internal circuits are connected to the signal pin 6, in certain implementations more or fewer internal circuits are provided.

The IC 30 can be electrically powered using the power-low pad 5 and the power-high pad 7. For example, the power-low pad 5 can be configured to receive a first supply voltage $V_1$ and the power-high pad 7 can be configured to receive a second supply voltage $V_2$. In the illustrated configuration, the IC 30 includes the voltage regulator 4, which can be used to generate a regulated voltage $V_{REG}$ from the second supply voltage $V_2$ received on the power-high pad 7. The regulated voltage $V_{REG}$ can be provided to the first and second internal circuits 45, 46 so as to provide a supply voltage suitable for electrically powering transistors and other circuitry of the first and second internal circuits 45, 46. However, in certain implementations the regulator 4 can be omitted and/or configured to generate additional regulated voltage supplies. In one embodiment, the regulator 4 is a low drop out (LDO) regulator.

The illustrated IC 30 includes a multi-tiered protection system that includes the primary protection devices 41a-41b, the secondary protection devices 42a-42b, and the tertiary protection devices 43a-43b. As will be described in detail below, the primary protection devices 41a-41b, the secondary protection devices 42a-42b, and the tertiary protection devices 43a-43b can each be configured to have different current handling capabilities so as to help protect the IC 30 against both IC-level and system-level transient electrical events. For example, the primary protection devices 41a-41b can be relatively large devices configured to have a current handling capability suitable for providing protection against system-level transient electrical events, such as ESD events defined by the IEC-61000-4-2 standards and/or EMI events defined by the ISO-7633-3 standards. Additionally, the secondary protection devices 42a-42b can be devices smaller than the primary protection devices 41a-41b, and can be configured to have relatively smaller current handling capabilities suitable for withstanding IC-level transient electrical events, such as those defined by the AEC-Q100 standards. In certain implementations, the tertiary protection devices 43a-43b can also be included to provide additional IC-level transient electrical event protection for sensitive circuitry of the IC 30. The tertiary protection devices 43a-43b can have a smaller current handling capability but a faster turn-on speed relative to the primary protection devices 41a-41b and the secondary protection devices 42a-42b. However, in other configurations the tertiary protection devices 43a-43b can be omitted in favor of using a two-tiered protection system that includes one or more primary protection devices and one or more secondary protection devices.

In one embodiment, the primary protection devices 41a-41b have a current handling capability that is at least a factor of 3 times larger than a current handling capability of the secondary protection devices 42a-42b. However, other implementations are possible.

As will be described in detail further below with reference to FIGS. 3A-3B, the secondary protection devices 42a-42b can be configured to have holding voltages greater than those of the primary protection devices 41a-41b, and the tertiary protection devices 43a-43b can be configured to have holding voltages greater than those of the primary protection devices 41a-41b and the secondary protection devices 42a-42b. Configuring the protection system in this manner can help the IC 30 to respond quickly to transient electrical events while preventing the secondary and/or tertiary protection devices from conducting currents exceeding their current handling capabilities.

For example, the tertiary protection devices 43a-43b can have a smaller current handling capability than the primary protection devices 41a-41b and the secondary protection devices 42a-42b, but can also have a quicker turn-on speed. Thus, when a transient signal is received on a pad, one or more of the tertiary protection devices 43a-43b can enter a low-impedance state relatively rapidly, thereby helping to reduce initial voltage overshoot on the pad. To prevent the tertiary protection devices 43a-43b from being damaged from sustained high current conditions, the secondary protection devices 42a-42b can be configured to have holding voltages lower than those of the tertiary protection devices 43a-43b. Thus, once the secondary protection devices 42a-42b have had sufficient time to activate, the pad voltage can be pulled or clamped to a voltage level below the holding voltages of the tertiary protection devices 43a-43b, thereby reducing or stopping the flow of current through the tertiary protection devices 43a-43b to prevent the tertiary protection devices 43a-43b from being damaged. Similarly, to prevent the secondary protection devices 42a-42b from being damaged due to sustained high current conditions, the primary protection devices 41a-41b can be configured to have holding voltages lower than those of the secondary protection devices 42a-42b such that once activated the primary protection devices 41a-41b clamp the pad voltage to a level sufficient to reduce or stop the flow of current through the secondary protection devices 42a-42b.

In the illustrated configuration, the first primary protection device 41a is electrically connected between the signal pad 6 and the power-low pad 5, and the second primary protection device 41b is electrically connected between the power-high pad 7 and the power-low pad 5. Additionally, the first secondary protection device 42a is electrically connected between the power-high pad 7 and the signal pad 6, and the second secondary protection device 42b is electrically connected between the power-high pad 7 and the regulated voltage $V_{REG}$. Furthermore, the first tertiary protection device 43a is electrically connected between an output of the second internal circuit 46 and the power-low pad 5, and the second tertiary protection device 43b is electrically connected between the regulated voltage $V_{REG}$ and the output of the second internal circuit 46. The arrangement of the primary protection devices 41a-41b, the secondary protection devices 42a-42b, and the tertiary protection devices 43a-43b illustrates one possible arrangement of the protection devices. However, in certain implementations, more or fewer of the primary protection devices 41a-41b, the secondary protection devices 42a-42b, and/or the tertiary protection devices 43a-43b are provided. Additionally, in some implementations one or more of the primary protection devices 41a-41b, the secondary protection devices 42a-42b, and the tertiary protection devices 43a-43b are connected in a different arrangement between the pads and/or nodes of the IC 30.

For example, the IC 30 may include a different arrangement of protection devices to meet certain performance specifications. For instance, the IEC-61000-4-2 standards define positive and negative polarity system-level ESD events that occur with respect to a power-low pad of a system. Thus, to configure the IC 30 to be IEC-61000-4-2 compliant, the first primary protection device 41a can be provided between the signal pad 6 and the power-low pad 5, and the second primary protection device 41b can be provided between the power-high pad 7 and the power-low pad 5. However, a primary protection device need not be included between the power-high pad 7 and the signal pad 6 to meet system-level ESD testing defined by IEC-61000-4-2. Thus, in certain implementations, an arrangement of the protection devices can be based at least in part on a desired set of performance specifications for which compliancy of the IC 30 is desired.

In the illustrated configuration, tertiary protection devices 43a, 43b have been provided at the output of the second internal circuit 46, but have been omitted at the output of the first internal circuit 45. In certain implementations, tertiary protection devices can be included to protect circuitry particularly sensitive to voltage overshoot or other transient stress conditions. However, the teachings herein are applicable to two-tiered protection systems that protect an internal circuit using primary and secondary protection devices only. Additionally, the number of tiers of protection can be expanded to four or more for certain configurations of internal circuitry.

The first and second resistors 47, 48 can also help provide protection to the first and second internal circuits 45, 46, respectively. For example, the first and second resistors 47, 48 can help prevent currents associated with a transient electrical event from flowing into or out of the first and second internal circuits 45, 46, respectively. However, the first and second resistors 47, 48 can also attenuate signals generated and/or received by the first and second internal circuits 45, 46, and thus it can be desirable to limit a value of or to eliminate the first and second resistors 47, 48 in certain configurations.

In some implementations, the first resistor 47 has a resistance selected to be in the range of about 0.5Ω and about 1 kΩ, for example, about 500Ω, and the second resistor 48 has a resistance selected to be in the range of about 0.5Ω and about 20Ω, for example, about 10Ω. However, persons having ordinary skill in the art will readily ascertain other suitable resistance values, such as resistance values associated with signal processing integrity and/or minimum noise constraints.

In certain implementations, the first and second capacitors 2a, 2b can be included between certain pads to help protect the pads from transient electrical events. For example, in the illustrated implementation, the first capacitor 2a has been electrically connected between the signal pad 6 and the power-low pad 5, and the second capacitor 2b has been electrically connected between the power-high pad 7 and the power-low pad 5. Although the first and second capacitors 2a, 2b can be included external to the IC 1 to help provide transient electrical protection, in certain implementations, the first and second capacitors 2a, 2b can be omitted. In some implementations, the first capacitor 2a has a capacitance selected to be in the range of about 0 pF and about 200 nF, for example, about 20 nF, and the second capacitor 2b has a capacitance selected to be in the range of about 100 pF and about 200 nF, for example, about 100 nF. However, persons having ordinary skill in the art will readily ascertain other suitable capacitance values.

Although a protection system has been illustrated in the context of an interface IC, protection systems can be used in a wide range of ICs and other electronics.

FIG. 3A is a graph 50 showing a relationship between current and voltage for one example of the primary, secondary, and tertiary protection devices of FIG. 2. The graph 50 includes a first quasi-static plot 51 of current versus voltage for a primary protection device, a second quasi-static plot 52 of current versus voltage for a secondary protection device, and a third quasi-static plot 53 of current versus voltage for a tertiary protection device, as can be obtained via transmission-line-pulsed (TLP) measurements.

The primary, secondary, and tertiary protection devices can be configured to maintain the voltage level at a pad within a predefined safe range by shunting a large portion of the current associated with a transient signal before the voltage of the transient signal reaches either a positive failure voltage $+V_F$ or a negative failure voltage $-V_F$ that would otherwise cause damage to the IC. Additionally, the primary, secondary, and tertiary protection devices can conduct a relatively low amount of current at the normal operating voltage $+V_{op}$, thereby reducing or minimizing static power dissipation resulting from the leakage current, which enhances the energy efficiency of the IC.

As shown in the graph 50, the primary, secondary, and tertiary protection devices have been configured to each have different quasi-static holding and trigger voltages.

For example, the primary protection device has been configured to transition from a high-impedance state to a low-impedance state when the voltage of the transient signal reaches a first positive trigger voltage $+V_{TR1}$. Thereafter, the primary protection device can remain in the low-impedance state as long as the transient signal voltage level is above a first positive holding voltage $+V_{H1}$. To provide protection against both negative and positive transient signals so as to provide bi-directional blocking voltage protection, the primary protection device has also been configured to transition from the high-impedance state to the low-impedance state when the voltage of the transient signal reaches a first negative trigger voltage $-V_{TR1}$, and to remain in the low-impedance state as long as the voltage magnitude of the negative transient signal is greater than the voltage magnitude of a first negative holding voltage $-V_{H1}$.

Additionally, the secondary protection device has been configured to have a second positive trigger voltage $+V_{TR2}$, a second positive holding voltage $+V_{H2}$, a second negative trigger voltage $-V_{TR2}$, and a second negative holding voltage $-V_{H2}$. Furthermore, the tertiary protection device has been configured to have a third positive trigger voltage $+V_{TR3}$, a third positive holding voltage $+V_{H3}$, a third negative trigger voltage $-V_{TR3}$, and a third negative holding voltage $-V_{H3}$.

By configuring the protection devices to each have a trigger voltage and a holding voltage, the protection device can have improved performance while having enhanced stability against unintended activation.

In the illustrated configuration, the secondary protection device has been configured to have positive holding and trigger voltages that are greater than the positive holding and trigger voltages of the primary protection device. For example, the second positive trigger voltage $+V_{TR2}$ and the second positive holding voltage $+V_{H2}$ have each been configured to be greater than the first positive trigger voltage $+V_{TR1}$ and the first positive holding voltage $+V_{H1}$. Furthermore, the tertiary protection device has been configured to have positive holding and trigger voltages that are greater than the positive holding and trigger voltages of both the primary and secondary protection devices.

Providing primary, secondary, and tertiary protection devices can help improve the protection afforded an IC relative to a scheme in which just a primary protection device is used in a protection system, even when the primary protection device has a current handling capability large enough to safely sustain the maximum transient signal current. In particular, using a multi-tiered protection system can help reduce voltage overshoot associated with the turn-on time of the primary protection device. For example, the primary protection device can be configured to have a larger current handling capability than the secondary and tertiary protection devices. However, since the primary protection device can be sized to be relatively large to reliably handle the large protection current, the primary protection device can be have a turn-on speed that is less than that of the secondary and tertiary protection devices. Likewise, the secondary protection device can be sized to have a current handling capability that is larger than that of the tertiary protection device, but can also have a slower turn-on speed than that of the tertiary protection device.

Since slow turn-on speed can lead to an initial voltage overshoot that can damage an IC, the multi-tiered protection schemes described herein can have reduced voltage overshoot by providing protection devices that turn-on relatively quickly to reduce peak voltage conditions. Additionally, the smaller and quicker devices with smaller current handling capability can be configured to have a higher holding voltage than a holding voltage of the slower devices with larger current handling capability. Configuring the protection system in this manner allows the larger devices once activated to clamp the pad voltage to a level sufficient to reduce or stop the current through the smaller devices, thereby preventing the smaller protection devices from being damaged by sustained high current conduction.

In certain implementations, such as the configuration illustrated in FIG. 3A, the trigger voltage of a slower device with a larger current handling capability is selected to be less than the trigger and holding voltages of faster devices with a high current handling capability. For example, the magnitude of a trigger voltage of a primary protection device can be selected to be less than the magnitude of a holding voltage of a secondary protection device and less than the magnitude of a trigger voltage of a secondary protection device. Similarly, the magnitude of a trigger voltage of a secondary protection device can be selected to be less than the magnitude of a holding voltage of a tertiary protection device and less than the magnitude of a trigger voltage of a tertiary protection device. Configuring the devices in this manner can help assure that the primary and secondary protection devices become activated during a transient electrical event. However, other implementations are possible, such as configurations in which a trigger voltage of a primary protection device is higher than a trigger voltage of the secondary and/or tertiary protection devices.

In one embodiment, the primary protection device has the largest size, slowest turn-on speed, and lowest holding voltage amongst the primary, secondary and tertiary protection devices. The holding voltage of the primary protection device can be configured to be less than the holding voltages of the secondary and tertiary protection devices in order to allow the primary protection device to also protect the secondary and tertiary protection devices upon activation during a very high voltage stress conditions. The primary protection device can be optimized to sustain system-level ESD and EMI stress conditions that can occur between pins associated with a high voltage interface. The secondary protection device can be smaller and faster than the primary protection device, and can provide additional discharge paths to render protection against device-level manufacturing and handling stress conditions, such as human body model (HBM) and/or charge device model (CDM) stress conditions that can occur at any pin of the IC. The tertiary protection devices can have the fastest turn-on speed and highest holding voltage of the protection devices, and can be used to shunt overvoltage before the primary protection devices have been activated, thereby protecting core devices from overstress beyond safe operating conditions.

In FIG. 3A, voltage is expressed along a horizontal axis, and current is expressed along a vertical axis. In the illustrated embodiment, the protection device has I-V characteristics that are symmetrical. In other implementations, the protection devices described herein can have asymmetrical I-V characteristics. For example, protection devices can have different trigger voltages, holding voltages, and/or failure voltages with different I-V curves in the positive and negative regions of the graph.

Figure 3B:
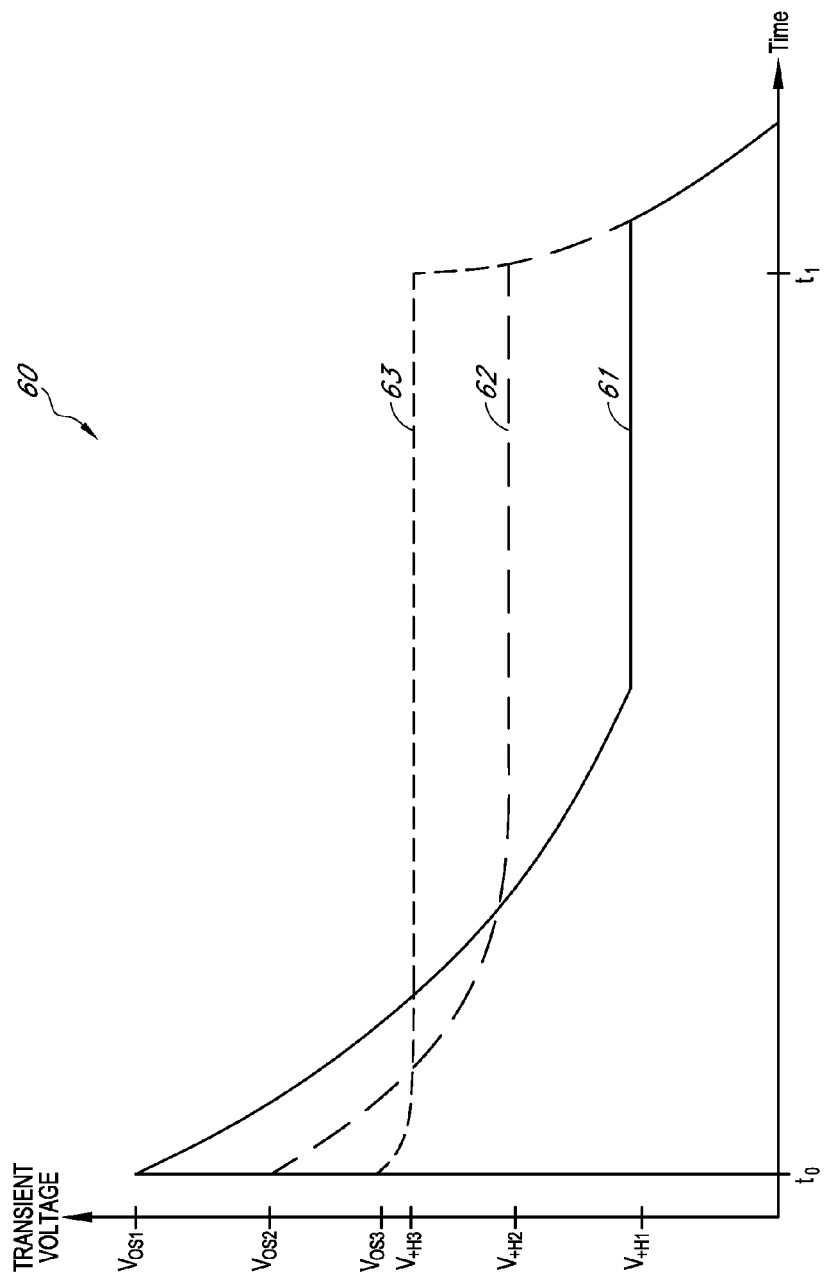
FIG. 3B is a graph of one example of voltage versus time for the primary, secondary, and tertiary protection devices of FIG. 3A.

FIG. 3B is a graph 60 of one example of voltage versus time for the primary, secondary, and tertiary protection devices of FIG. 3A. The graph 60 includes a first plot 61 of voltage versus time for a primary protection device, a second plot 62 of voltage versus time for a secondary protection device, and a third plot 63 of voltage versus time for a tertiary protection device. The first to third plots 61 to 63 can illustrate transient voltage versus time when a transient electrical event starting at time $t_0$ and ending at time $t_1$ is received on a pad protected by a primary protection device, a secondary protection device, and a tertiary protection device, respectively.

As shown in the first to third plots 61-63 of FIG. 3B, the primary protection device can have a voltage overshoot greater than that of the secondary and tertiary protection devices, and the secondary protection device can have a voltage overshoot greater than that of the tertiary protection device. For example, a first voltage overshoot $V_{OS1}$ of the primary protection device can be greater than both a second voltage overshoot $V_{OS2}$ of the secondary protection device and a third voltage overshoot $V_{OS3}$ of the tertiary protection device. Additionally, the second voltage overshoot $V_{OS2}$ of the secondary protection device can be greater than the third voltage overshoot $V_{OS3}$ of the tertiary protection device. The voltage overshoot can be caused by a variety of factors, such as a turn-on speed associated with activating the protection devices, which can be of a longer duration for protection devices sized to have a relatively large current handling capability.

Although the third voltage overshoot $V_{OS3}$ of the tertiary protection device can have the smallest magnitude, the tertiary protection device may become damaged when conducting a large current for the duration of the transient electrical event. To prevent the tertiary protection device from being damaged from sustained high current conditions, the secondary and primary protection devices can be configured to each have a holding voltage lower than the holding voltage of the tertiary protection device. Thus, once the secondary and primary protection device has had sufficient time to activate, the transient voltage can be clamped to a voltage level below the holding voltage of the tertiary protection device, thereby reducing or stopping the current through the tertiary protection device to prevent the tertiary protection device from being damaged. Similarly, to prevent the secondary protection device from being damaged due to sustained high current conditions, the primary protection device can be configured to have a holding voltage lower than the holding voltage of the secondary protection device such that once activated the primary protection device clamps the pad voltage to a level sufficient to reduce or stop the current through the secondary protection device.

Figure 4A:
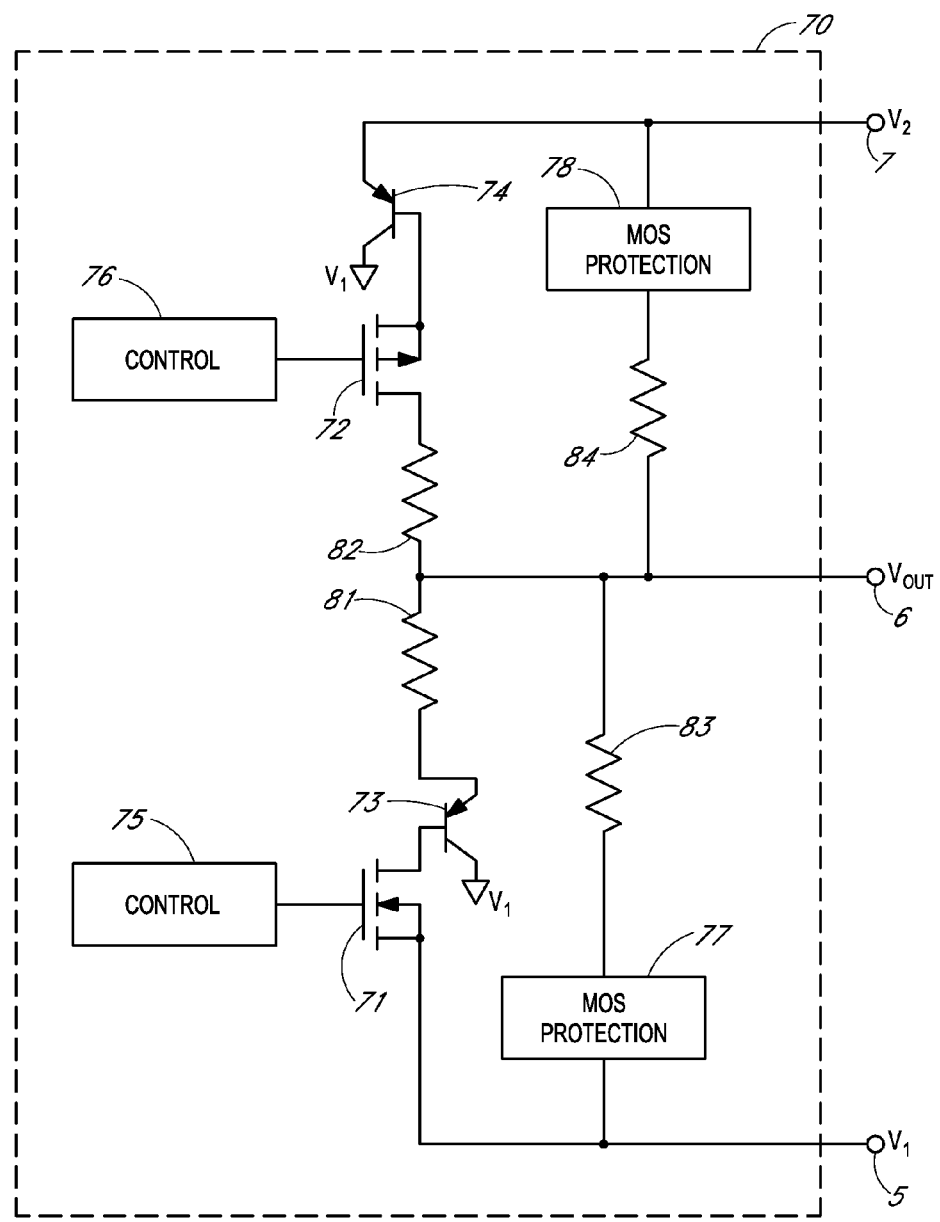
FIGS. 4A-4C are circuit diagrams of various architectures of an internal circuit of an IC interface.
Figure 4B:
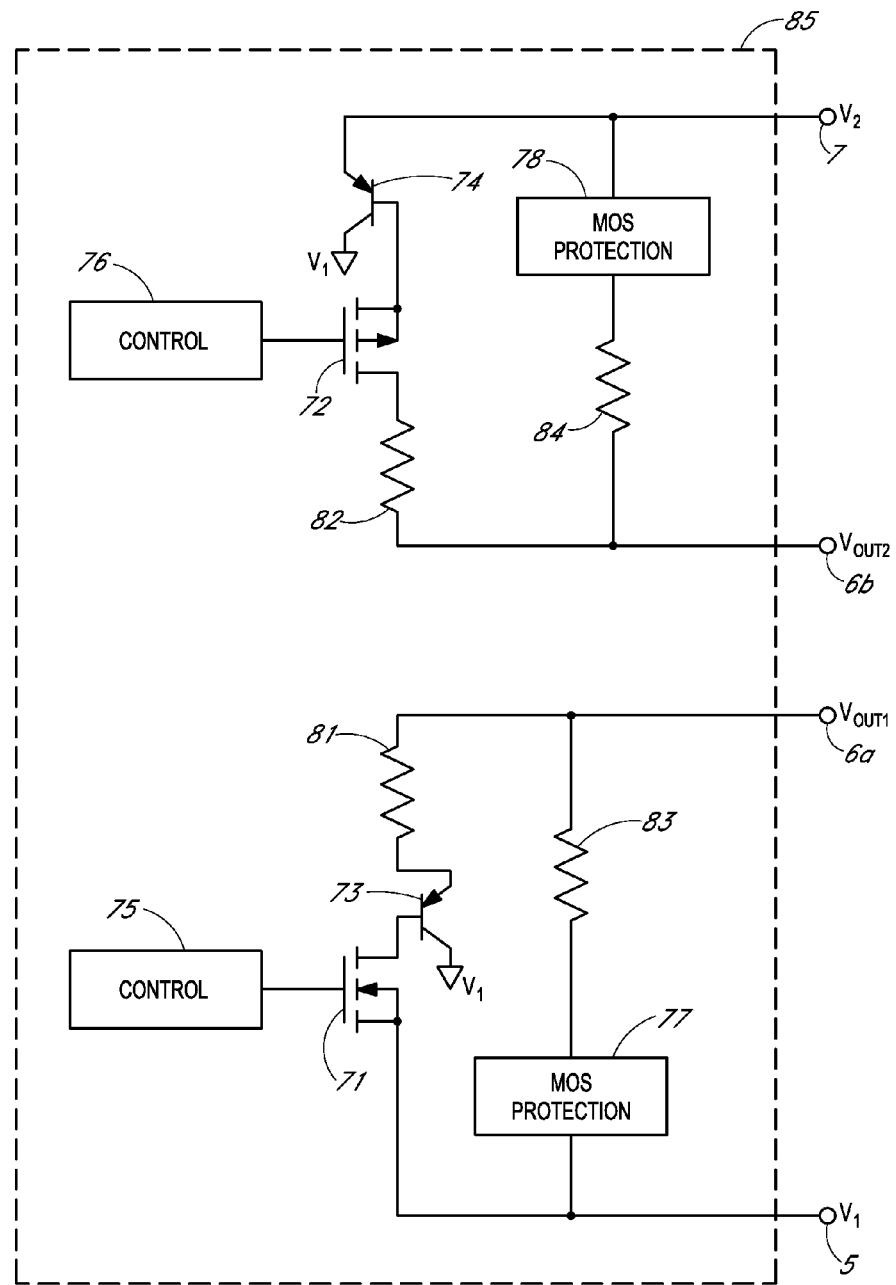
Figure 4C:
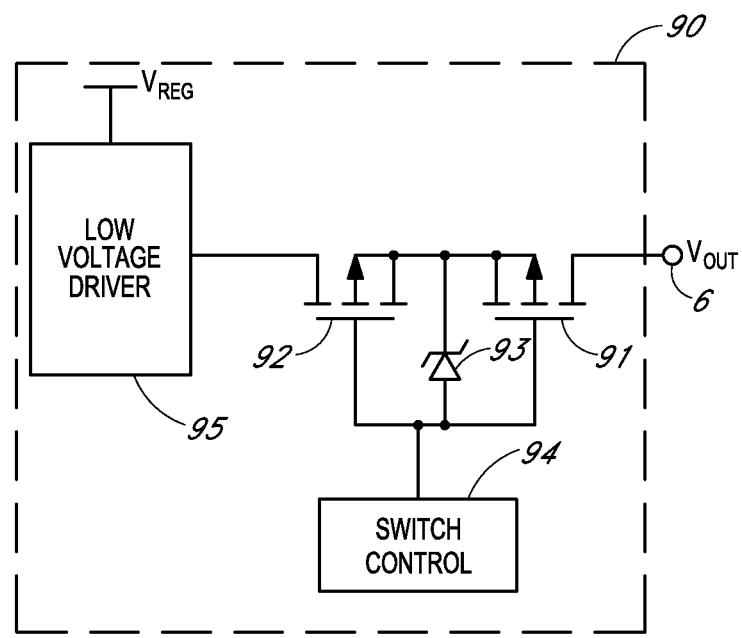

FIGS. 4A-4C are circuit diagrams of various architectures of an internal circuit of an IC interface.

FIG. 4A is a circuit diagram of one example of an internal circuit 70 of an IC. The internal circuit 70 includes an n-type double-diffused or extended drain metal oxide semiconductor (NDMOS) transistor 71, a p-type double-diffused or extended drain metal oxide semiconductor (PDMOS) transistor 72, a first diode-connected PNP bipolar transistor 73, a second diode-connected PNP bipolar transistor 74, a first control circuit 75, a second control circuit 76, a first MOS protection circuit 77, a second MOS protection circuit 78, and first to fourth resistors 81-84. The internal circuit 70 is illustrated as being electrically connected to a power-low pad 5, to a signal pad 6, and to a power-high pad 7 of an IC. The internal circuit 70 can be adapted to serve as, for example, the first and/or second internal circuits 45, 46 of FIG. 2. The internal circuit 70 can be used, for example, as a driver circuit for a LIN interface.

The NDMOS transistor 71 includes a body and source electrically connected to the power-low pad 5. The NDMOS transistor 71 further includes a drain electrically connected to a base of the first diode-connected PNP bipolar transistor 73 and a gate electrically connected to the first control circuit 75. The PDMOS transistor 72 includes a body and a source electrically connected to a base of the second diode-connected PNP bipolar transistor 74. The PDMOS transistor 72 further includes a drain electrically connected to a first end of the second resistor 82 and a gate electrically connected to the second control circuit 76. As used herein and as persons having ordinary skill in the art will appreciate, MOS transistors can have gates made out of materials that are not metals, such as poly silicon, and can have dielectric regions implemented not just with silicon oxide, but with other dielectrics, such as high-k dielectrics.

The first diode-connected PNP bipolar transistor 73 further includes a collector electrically connected to the power-low pad 5 and an emitter electrically connected to a first end of the first resistor 81. The second diode-connected PNP bipolar transistor 74 further includes a collector electrically connected to the power-low pad 5 and an emitter electrically connected to the power-high pad 7. The first resistor 81 further includes a second end electrically connected to a second end of the second resistor 82, to a first end of the third resistor 83, to a first end of the fourth resistor 84, and to the signal pad 6. The first MOS protection circuit 77 is electrically connected between a second end of the third resistor 83 and the power-low pad 5. The second MOS protection circuit 78 is electrically connected between a second end of the fourth resistor 84 and the power-high pad 7.

The internal circuit 70 can be used to control a voltage level of the signal pad 6. For example, the NDMOS and PDMOS transistors 71, 72 include gates electrically connected to the first and second control circuits 75, 76, respectively. In certain implementations, the gate of the NDMOS transistor 71 is controlled to a voltage level corresponding to a desired sink current of the internal circuit 70, and the gate of the PDMOS transistor 72 is controlled to a voltage level corresponding to a desired source current of the PDMOS transistor 72 so as to control a voltage level of the signal pad 6.

The first and second diode-connected PNP bipolar transistors 73, 74 can help extend the operational voltage range of the signal pad 6. For example, the signaling conditions on the signal pad 6 may include positive and negative voltage signaling levels, and the first and second diode-connected PNP bipolar transistors 73, 74 can be used to prevent the bodies of the NDMOS and PDMOS transistors 71, 72 from becoming forward-biased when the signal pad 6 falls below the voltage level of the power-low pad 5 or rises above the voltage level of the power-high pad 7. In certain implementations, such as implementations using a silicon-on-insulator (SOI) or other suitable isolation process, the first and second diode-connected PNP bipolar transistors 73, 74 can be omitted in favor of using high voltage blocking diodes. Although FIG. 4A illustrates a particular ordering of the NDMOS and PDMOS transistors 71, 72 and the first and second diode-connected PNP bipolar transistors 73, 74, other configurations are possible. For example, when using certain processes, such as SOI processes, the order or the PDMOS transistor 72 and the second diode-connected PNP bipolar transistor 74 can be reversed.

The first and second resistors 81, 82 can help prevent current flowing through the NDMOS and PDMOS transistors 71, 72, respectively, during a transient electrical event. In some implementations, the first resistor 81 has a resistance selected to be in the range of about 0Ω and about 5Ω, for example, about 0.5Ω, and the second resistor 82 has a resistance selected to be in the range of about 0Ω and about 5Ω, for example, about 0.5Ω. However, persons having ordinary skill in the art will readily ascertain other suitable resistance values, such as resistance values associated with signal processing integrity and/or minimum noise constraints. Additionally, in certain implementations, either or both of the first and second resistors 81, 82 can be omitted.

When a transient electrical event is received on the signal pad 6, the voltage of the signal pad 6 can increase until trigger voltages of the protection devices connected to the signal pad 6 are reached (see FIG. 2). However, in certain implementations, there can be an overshoot of voltage on the signal pad 6 before the protection devices activate. In certain implementations, the first and second MOS protection circuits 77, 78 can be provided to provide additional protection to the NDMOS and PDMOS transistors 71, 72, respectively. However, in other implementations, either or both of the first and second MOS protection circuits 77, 78 can be omitted.

In certain implementations, the third resistor 83 can be placed in series with the first MOS protection circuit 77 and the fourth resistor 84 can be placed in series with the second MOS protection circuit 78 so as to increase the impedance of parasitic electrical paths between the power-high pad 7 and the power-low pad 5 through the first and second MOS protection circuits 77, 78. In one embodiment, the third resistor 83 has a resistance in the range of about 0Ω to about 5Ω, for example, about 1Ω, and the fourth resistor 84 has a resistance in the range of about 0Ω to about 5Ω, for example, about 1Ω. However, persons having ordinary skill in the art will readily ascertain other suitable resistance values. Additionally, in certain implementations either or both of the third and fourth resistors 83, 84 can be omitted.

FIG. 4B is a circuit diagram of another example of an internal circuit 85 of an IC. The internal circuit 85 includes the NDMOS and PDMOS transistors 71, 72, the first and second diode-connected PNP bipolar transistors 73, 74, the first and second control circuits 75, 76, the first and second MOS protection circuits 77, 78, and the first to fourth resistors 81-84. The internal circuit 85 is illustrated as being electrically connected to a power-low pad 5, to a first signal pad 6a, to a second signal pad 6b and to a power-high pad 7 of an IC. The internal circuit 85 can be adapted to serve as, for example, the first and/or second internal circuits 45, 46 of FIG. 2 by including an additional signal pad in the IC 30 of FIG. 2. The internal circuit 85 can be used, for example, as a driver circuit for a CAN interface.

The internal circuit 85 of FIG. 4B can be similar to the internal circuit 70 of FIG. 4A. However, in contrast to the internal circuit 70 of FIG. 4A in which the NDMOS and PDMOS transistors 71, 72 have been configured to drive the signal pin 6, the internal circuit 85 of FIG. 4B illustrates a differential configuration in which the NDMOS and PDMOS transistors 71, 72 have been configured to drive the first and second signal pins 6a, 6b, respectively. For example, the NDMOS transistor 71 has been configured to drive the first signal pin 6a through the first resistor 81 and the first diode-connected PNP bipolar transistor 73, and the PDMOS transistor 72 has been configured to drive the second signal pin 6b through the second resistor 82. Additional details of the internal circuit 85 can be similar to those described above with respect to FIG. 4A.

FIG. 4C is a circuit diagram of another example of an internal circuit 90 of an IC. The internal circuit 90 includes a first PDMOS transistor 91, a second PDMOS transistor 92, a Zener diode 93, a switch control circuit 94, and a low voltage driver 95. The internal circuit 90 is illustrated as being electrically connected to a signal pad 6 of an IC. The internal circuit 90 can be adapted to serve as, for example, the first and/or second internal circuits 45, 46 of FIG. 2. The internal circuit 90 can be used, for example, as a driver circuit for an interface.

The first PDMOS transistor 91 includes a drain electrically connected to the signal pad 6. The first PDMOS transistor 91 further includes a body and source electrically connected to a body and source of the second PDMOS transistor 92 and to a cathode of the Zener diode 93. The first PDMOS transistor 91 further includes a gate electrically connected to a gate of the second PDMOS transistor 92, to an anode of the Zener diode 93, and to the switch control circuit 94. The second PDMOS transistor 92 further includes a drain electrically connected to the low-voltage driver 95, which is electrically powered using the regulated voltage supply $V_{REG}$.

The internal circuit 90 can be used to control a voltage level of the signal pad 6. For example, the first and second PDMOS transistors 91, 92 include gates electrically connected to the switch control circuit 94, which can be used to change the resistance between the low-voltage driver 95 and the signal pin 6 by controlling the channel impedance of the first and second PDMOS transistors 91, 92.

The Zener diode 93 can help prevent damage to the first and second PDMOS transistors 91, 92. For example, when a transient electrical event is received on the signal pad 6, the magnitude of the voltage of the signal pad 6 can increase until trigger voltages of the protection devices used to protect the pad are reached (see FIG. 2). The Zener diode 93 can provide bi-directional breakdown protection during a transient electrical event to help prevent the magnitudes of the gate-drain and/or gate-source voltages of the first and second PDMOS transistors 91, 92 from reaching levels associated with transistor damage.

Figure 5:
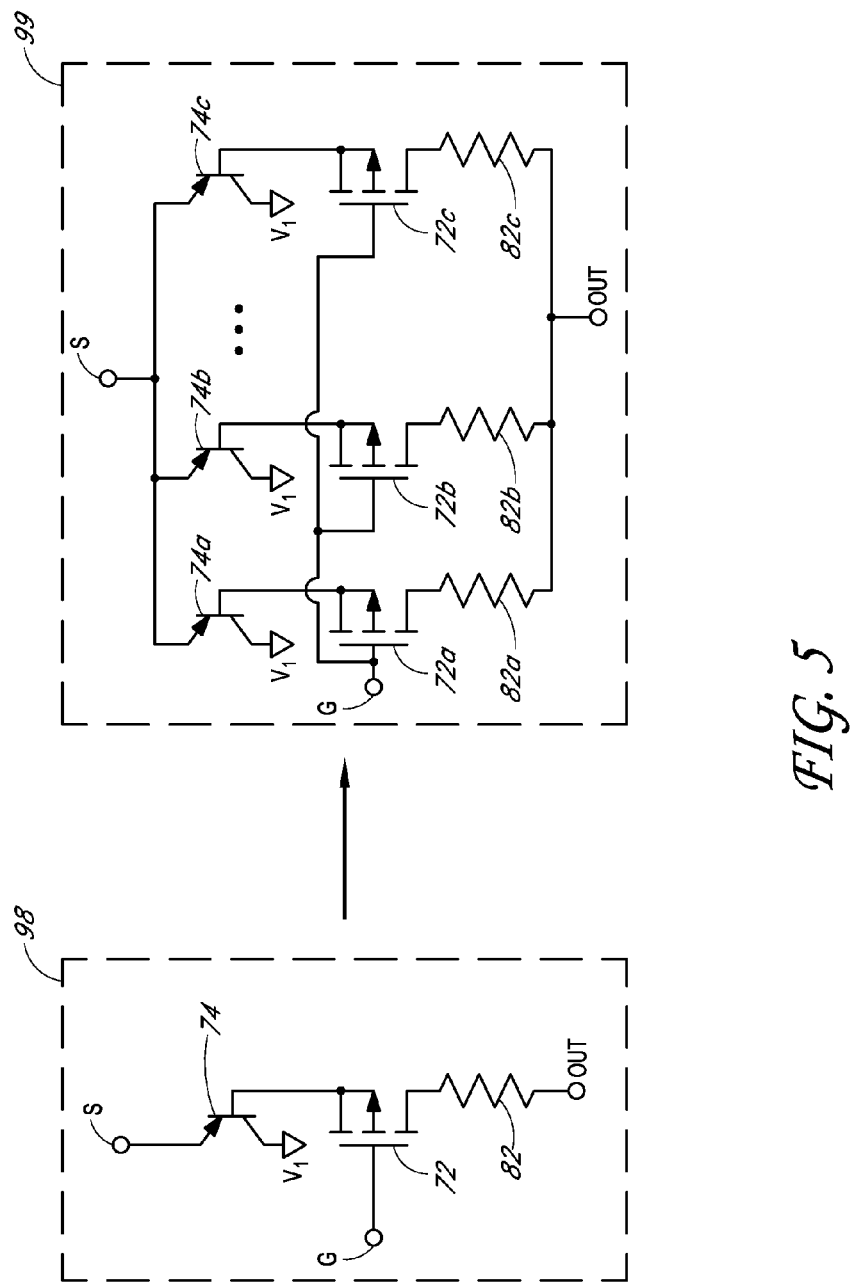
FIG. 5 is a circuit diagram illustrating two implementations of a portion of an internal circuit of an IC.

FIG. 5 is a circuit diagram illustrating two implementations of a portion of an internal circuit. As will be described below, the circuit diagram illustrates that series components of an internal circuit can be implemented as an equivalent parallel combination of inter-finger-ballasted lumped components in series. Configuring the components in this manner can provide for enhanced robustness when co-designed with the protection architecture.

As shown in the first circuit implementation 98 of FIG. 5, an internal circuit can include a PDMOS transistor 72 electrically connected in series with a diode-connected PNP bipolar transistor 74 and a resistor 82. For example, a drain of the PDMOS transistor 72 can be electrically connected to the first resistor 82, and a source and bulk of the PDMOS transistor 72 can be electrically connected to a base of the diode-connected PNP bipolar transistor 74. The diode-connected PNP bipolar transistor 74 can further include a collector electrically connected to a first voltage supply $V_1$, and an emitter that can be connected to, for example, a power-high pad. The diode-connected PNP bipolar transistor 74 can operate as a blocking junction.

In certain implementations, an internal circuit that includes series combination of one or more transistors and a resistor can be implemented using multiple sub-circuits or legs in a layout array. Configuring the internal circuit layout in this manner can serve as protection co-design to protect transistors from damage by providing a larger resistance looking into each leg relative to a configuration using a single leg while meeting or exceeding a design specification for low net resistance. For example, in an implementation using four legs to implement the series combination of a transistor and a 5Ω resistor, each of the four transistor legs can be protected from transient electrical events using a 20Ω resistor while providing an equivalent resistance to signals generated by the transistors during normal operation of the internal circuit.

A second circuit implementation 99 of FIG. 5 illustrates one example of a configuration of an internal circuit that uses multiple legs. For example, the second circuit implementation 99 includes first to third PDMOS transistor legs 72-72c, first to third diode-connected PNP bipolar transistor legs 74a-74c, and first to third resistor segments 82a-82c. The emitters of the first to third diode-connected PNP bipolar transistor legs 74a-74c have been electrically connected to one another. Additionally, the gates of the first to third PDMOS transistor legs 72a-72c have been electrically connected to one another. Additionally, the sources and bodies of the first to third PDMOS transistor legs 72a-72c have been electrically connected to the bases of the first to third diode-connected PNP bipolar transistor legs 74a-74c, respectively. The first to third diode-connected PNP bipolar transistor legs 74a-74c further include collectors electrically connected to the first voltage supply $V_1$. The first to third PDMOS transistor legs 72a-72c further include drains electrically connected to first ends of the first to third resistor segments 82a-82c, respectively. The second ends of the first to third resistor segments 82a-82c have been electrically connected to one another.

Although the second circuit implementation 99 of FIG. 5 illustrates an implementation using three legs, the second circuit implementation 99 can be adapted to include more or fewer legs. Furthermore, other circuits can be formed using multiple legs in addition to the circuit shown in FIG. 5. For example, in certain implementations, the series combination of the NDMOS transistor 71, the first diode-connected PNP bipolar transistor 73, and the first resistor 89 of FIGS. 4A-4B can be implemented using multiple legs as part of a protection architecture-core circuit co-design optimization.

Overview of Certain Embodiments of Protection Devices

Figure 6:
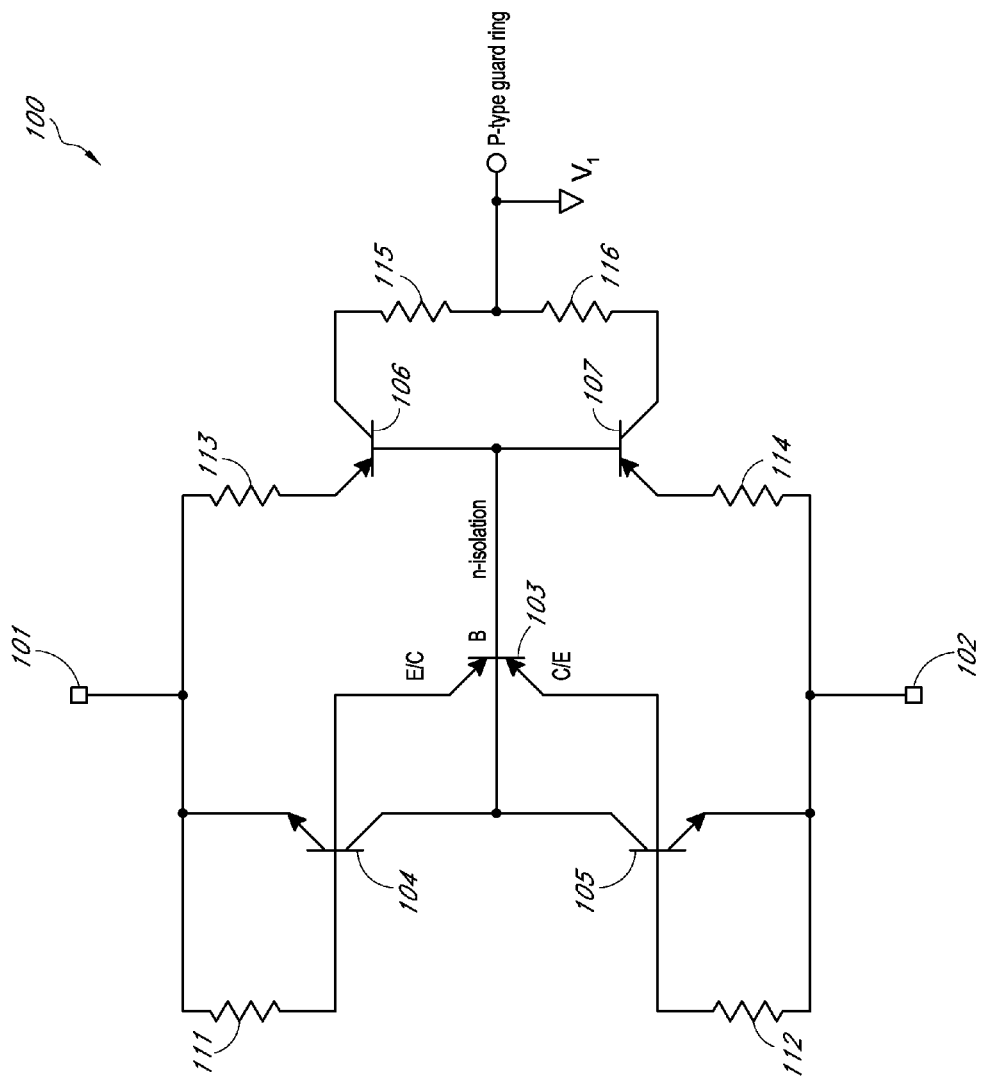
FIG. 6 is a circuit diagram illustrating a protection circuit according to one embodiment.

FIG. 6 is a circuit diagram illustrating a protection circuit 100 according to one embodiment. The illustrated protection circuit 100 is electrically connected between a first pad 101 and a second pad 102, and can be used to, for example, provide bi-directional blocking voltage protection. The protection circuit 100 includes a bi-directional bipolar transistor 103, first and second NPN bipolar transistors 104, 105, first and second PNP bipolar transistors 106, 107, and first to sixth resistors 111-116. As will be described in detail below, the protection circuit 100 can be implemented in various configurations to operate as one or more of the primary, secondary, and tertiary protection devices 41a-41b, 42a-42b, 43a-43c of FIG. 2.

The protection circuit 100 can be electrically coupled between the first and second pads 101, 102 such that a current shunt path can be established between the pads when there is an overvoltage or undervoltage condition. For example, the first pad can be a power-high pad or signal pad of an IC, such as the power-high pad 7 or signal pad 6 of FIG. 2, and the second pad can be a power-low pad, such as the power-low pad 5 of FIG. 2. In certain implementations, the second pad 102 is a ground pad. The protection circuit 100 can provide a low-impedance path between the first pad 101 and the second pad 102 during a transient electrical event.

The first NPN bipolar transistor 104 includes an emitter electrically connected to a first end of the first resistor 111, to a first end of the third resistor 113, and to the first pad 101. The first NPN bipolar transistor 104 further includes a base electrically connected to an emitter/collector E/C of the bi-directional bipolar transistor 103 and to a second end of the first resistor 111. The second NPN bipolar transistor 105 includes an emitter electrically connected to a first end of the second resistor 112, to a first end of the fourth resistor 114, and to the second pad 102. The second NPN bipolar transistor 105 further includes a base electrically connected to a collector/emitter C/E of the bi-directional bipolar transistor 103 and to a second end of the second resistor 112.

The bi-directional bipolar transistor 103 further includes a base electrically connected to a collector of the first NPN bipolar transistor 104, to a collector of the second NPN bipolar transistor 105, to a base of the first PNP bipolar transistor 106, and to a base of the second PNP bipolar transistor 107. In certain implementations, the base of the bi-directional bipolar transistor 103 is formed from an n-well that is electrically connected to an electrically floating n-type isolation layer. The first PNP bipolar transistor 106 further includes an emitter electrically connected to a second end of the third resistor 113 and a collector electrically connected to a first end of the fifth resistor 115. The second PNP bipolar transistor 107 further includes an emitter electrically connected to a second end of the fourth resistor 114 and a collector electrically connected to a first end of the sixth resistor 116. The sixth resistor 116 further includes a second end electrically connected to a second end of the fifth resistor 115 and to the first supply voltage $V_1$, which can be, for example, a ground node. In certain implementations, the second ends of the fifth and sixth resistors 115, 116 are electrically connected to a p-type guard ring.

The bi-directional bipolar transistor 103 can operate bi-directionally, and an operation of the emitter/collector E/C and the collector/emitter C/E as emitter and collector can depend on the voltage conditions of the first and second pads 101, 102. For example, when a voltage difference between the first pad 101 and the second pad 102 is greater than about a positive trigger voltage (see, for example, voltages $+V_{T1}$, $+V_{T2}$, and $+V_{T3}$ of FIG. 3A) of the protection circuit 100, the emitter/collector E/C of the bi-directional bipolar transistor 103 serves as an emitter and the collector/emitter C/E of the bi-directional bipolar transistor serves as a collector. In contrast, when a voltage difference between the first pad 101 and the second pad 102 is less than about a negative trigger voltage (see, for example, voltages $-V_{T1}$, $-V_{T2}$, and $-V_{T3}$ of FIG. 3A) of the protection circuit 100, the emitter/collector E/C of the bi-directional bipolar transistor 103 serves as a collector and the collector/emitter C/E of the bi-directional bipolar transistor 103 serves as an emitter.

In certain implementations, the bi-directional bipolar transistor 103 can be a PNP bipolar transistor configured to control the response and current discharge of the protection circuit 100 during an overvoltage or undervoltage condition. For example, the first and second NPN bipolar transistors 104, 105 can be configured to have limited injection efficiency at their emitter-base junctions, thereby allowing the bi-directional bipolar transistor 103 to substantially control the response characteristic.

The first to sixth resistors 111-116 can be formed using, for example, the resistivity of doped regions to achieve the target resistances. For example, in one embodiment, the first to sixth resistors 111-116 are implemented by using the resistivity of n-type or p-type wells to achieve a turn-on speed and stability desired for a particular application. For example, the resistance of the first and second resistors 111, 112 can be selected to obtain a desired build-up to forward-bias the emitter-base junctions of the first and second NPN bipolar transistors 104, 105, respectively.

In one implementation, the protection device 100 is adapted to serve as either or both of the primary protection devices 41a-41b, either or both of the secondary protection devices 42a-42b and/or either or both of the tertiary protection devices 43a-43b of FIG. 2.

Figure 7A:
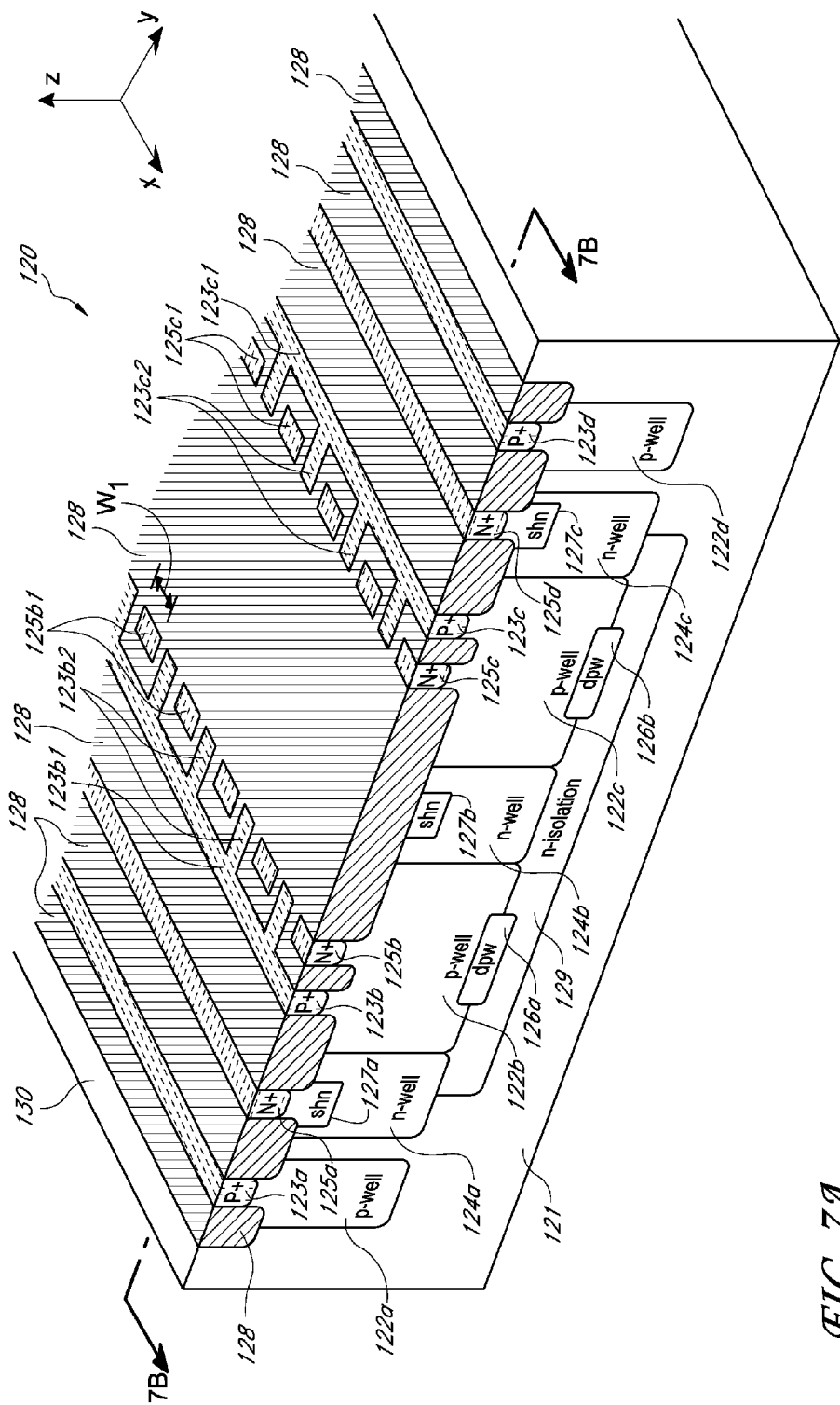
FIG. 7A is a schematic perspective view of a protection device implementing the protection circuit of FIG. 6 according to one embodiment.

FIG. 7A is a schematic perspective view of a protection device 120 implementing the protection circuit 100 of FIG. 6 according to one embodiment. The protection device 120 includes a substrate 121, first to fourth p-wells 122a-122d, first to fourth p-type active areas 123a-123d, first to third n-wells 124a-124c, first to fourth n-type active areas 125a-125d, first and second deep p-wells 126a, 126b, first to third shallow n-wells 127a-127c, oxide regions 128, and n-type isolation layer 129. The protection device 120 illustrates one example of a protection device suitable for use as the tertiary protection devices 43a, 43b of FIG. 2.

Although the protection device 120 illustrates one embodiment of the tertiary protection device, other configurations can be used. For example, in certain implementations the tertiary protection device can be implemented using back-to-back high voltage avalanche blocking diode structures, which can be suitable for implementing low current carrying capability clamping components without occupying a relatively large area.

As illustrated in FIG. 7A, the substrate 121 includes the first to third n-wells 124a-124c and the first to fourth p-wells 122a-122d formed therein. The second and third p-wells 122b, 122c are disposed on opposite sides of the second n-well 124b. The first n-well 124a is disposed on a side of the second p-well 122b opposite the second n-well 124b. The third n-well 124c is disposed on a side of the third p-well 122c opposite the second n-well 124b. The n-type isolation layer 129 is disposed beneath the second n-well 124b, the second and third p-wells 122b, 122c, and beneath a portion of the first and third n-wells 124a, 124c. The first p-well 122a is formed adjacent the first n-well 124a on a side of the first n-well 124a opposite the second p-well 122b. The fourth p-well 122d is formed adjacent the third n-well 124c on a side of the third n-well 124c opposite the third p-well 122c. In the illustrated configuration, the first and fourth p-wells 122a, 122d are spaced from the first and third n-wells 124a, 124c, respectively, such that the first p-well 122a does not abut the first n-well 124a and the fourth p-well 122d does not abut the third n-well 124c. However, other implementations are possible.

The first, second, and third shallow n-wells 127a-127c are formed in the first, second, and third n-wells 124a-124c, respectively. The first deep p-well 126a is formed along a boundary between the second p-well 122b and the n-type isolation layer 129, and the second deep p-well 126b is formed along a boundary between the third p-well 122c and the n-type isolation layer 129.

In the illustrated configuration, the protection device 120 is formed in the substrate 121, which can be a p-type substrate. In another embodiment, the substrate can include a p-type epitaxial layer formed on a silicon (Si) substrate. Although not illustrated in FIG. 7A, the substrate 121 can also include other devices or structures formed therein.

The first to fourth p-type active areas 123a-123d are disposed in the first to fourth p-wells 122a-122d, respectively. The first and fourth n-type active areas 125a, 125d are disposed in the first and third shallow n-wells 127a, 127c, respectively, of the first and third n-wells 124a, 124c. The second n-type active area 125b is disposed in the second p-well 122b, and positioned so as to be between a portion of the second p-type active area 123b and the second n-well 124b. The third n-type active area 125c is disposed in the third p-well 122c, and positioned so as to be between a portion of the third p-type active area 123c and the second n-well 124b.

In the illustrated configuration, the second n-type active area 125b includes a plurality of island regions 125b1 disposed along the x-direction, and the third n-type active area 125c includes a plurality of island regions 125c1 disposed along the x-direction. Additionally, the second p-type active area 123b includes an elongated region 123b1 extending in the x-direction and a plurality of protruding regions 123b2 that extend in the y-direction toward the second n-well 124b. As shown in FIG. 7A, each of the protruding regions 123b2 extends between two of the island regions 125b1. Similarly, the third p-type active area 123c includes an elongated region 123c1 extending in the x-direction and a plurality of protruding regions 123c2 extending in the y-direction toward the second n-well 124b. Each of the protruding regions 123c2 extends between two of the island regions 125c1. As will be described in detail further below, configuring the second and third p-type active areas 123b, 123c and the second and third n-type active areas 125b, 125c in this manner can aid in increasing the holding and/or trigger voltages of the protection device 120, thereby helping to make the protection device 120 suitable for operation as the tertiary protection devices 43a, 43b of FIG. 2. While illustrated and described with reference to x-directions, y-directions, and z-directions, it will be understood that the directions can be interchanged and can vary based on view.

In one embodiment, the width $W_1$ of the island regions 125b1 in the x-direction is in the range of about 0.4-μm to about 1.5-μm, for example, about 1-μm. However, other implementations are possible. For example, the width $W_1$ can be increased to enhance action of the NPN bipolar transistors and to lower holding voltage, thereby helping to control the holding voltage for various configurations of the primary, secondary and tertiary protection devices.

The first and third n-wells 124a, 124c and the n-type isolation layer 129 can aid in electrically isolating the second and third p-wells 122b, 122c from the substrate 121, thereby permitting the p-type substrate 121 and the second and third p-wells 122b, 122c to operate at different electrical potentials. As used herein, and as will be understood by one of skill in the art, the term "n-type isolation layer" refers to any suitable n-type isolation layer, including, for example, those used in silicon-on-insulator (SOI) technologies, buried n-layer technologies, or in deep n-well technologies. In certain implementations described herein, the first to third n-wells 124a-124c and the n-type isolation layer 129 are configured to be electrically floating. Although the protection device 120 is illustrated as including the first and third n-wells 124a, 124c and the n-type isolation layer 129, in certain implementations, the protection device 120 can be isolated from a substrate in other ways. For example, isolation can be achieved when using silicon-on-insulator (SOI) processes by using dielectric structures. SOI processes can be employed in a variety of applications, including, for example, applications having high electrical robustness requirements.

The first and fourth p-wells 122a, 122d and the first and fourth p-type active areas 123a, 123d can form a guard structure of the protection device 120. For example, in an annular configuration, the first and fourth p-wells 122a, 122d can form a portion of a guard ring that surrounds the protection device 120 when viewed from above the substrate 121. The guard ring can be employed to eliminate the formation of unintended parasitic paths between the protection device 120 and surrounding semiconductor components when integrated on-chip.

The illustrated protection device 120 includes the oxide regions 128. Formation of the isolation regions can involve etching trenches in the substrate 121, filling the trenches with a dielectric, such as silicon dioxide ($SiO_2$), and removing the excess dielectric using any suitable method, such as chemical-mechanical planarization. In certain implementations, the oxide regions 128 can be shallow trench (STI) regions or local oxidation of silicon (LOCOS) regions disposed between active areas.

In one embodiment, the first to fourth p-wells 122a-122d and the first to third n-wells 124a-124c can have a depth similar to one another, such as a depth between about 3 μm and about 5.5 μm relative to a surface 130 of the substrate 121. In some implementations, the first to fourth p-type active areas 123a-123d and the first to fourth n-type active areas 125a-125d have a depth that is about 15 times to about 25 times less than a depth of the well within which the active area is formed. In certain implementations, the first to third shallow n-wells 127a-127c have a depth that is about 1.2 times to about 2.5 times less than a depth of the first to third n-wells 124a-124c. The oxide regions 128 can have any suitable depth, such as depth that is about 5 times to about 15 times less than the depth of the first to fourth p-wells 122a-122d. In certain implementations, the oxide regions 128 can be relatively deeper than the first to fourth p-type active areas 123a-123d and the first to fourth n-type active areas 125a-125d.

The protection device 120 can undergo back end processing to form contacts and metallization. Skilled artisans will appreciate that these details have been omitted from this figure for clarity.

Figure 7B:
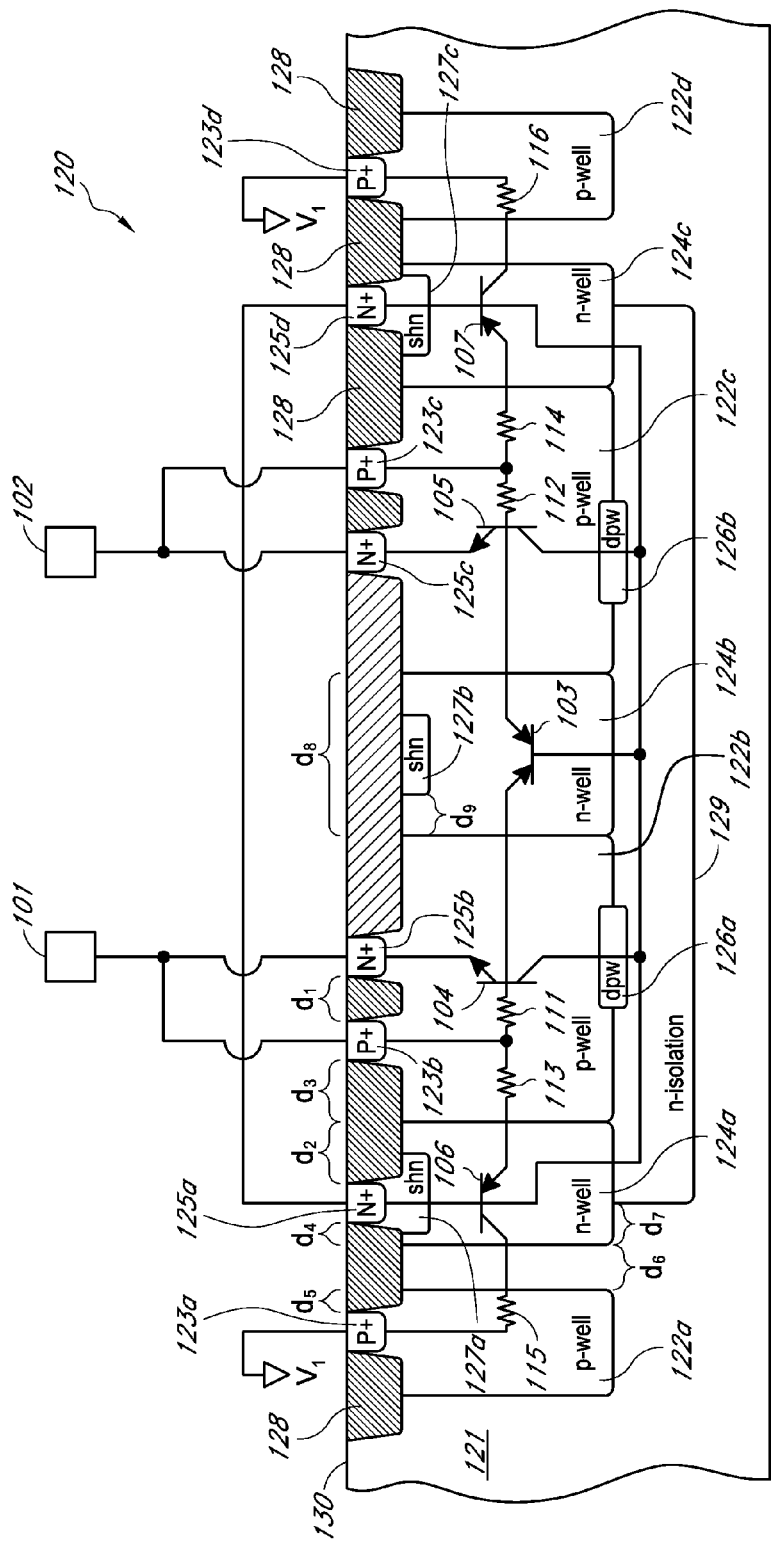
FIG. 7B is an annotated cross section view of the protection device of FIG. 7A, taken along the lines 7B-7B.

FIG. 7B is a cross section view of the protection device 120 of FIG. 7A, taken along the lines 7B-7B. The protection device 120 includes the substrate 121, the first to fourth p-wells 122a-122d, the first to fourth p-type active areas 123a-123d, the first to third n-wells 124a-124c, the first to fourth n-type active areas 125a-125d, the first and second deep p-wells 126a, 126b, the first to third shallow n-wells 127a-127c, the oxide regions 128, and the n-type isolation layer 129, which can be as described above with respect to FIG. 7A.

The cross-section of the protection device 120 has been annotated to show examples of circuit devices formed from the illustrated structure, such as the bi-directional bipolar transistor 103, the first and second NPN bipolar transistors 104, 105, the first and second PNP bipolar transistors 106, 107, and the first to sixth resistors 111-116. Furthermore, the cross-section has been annotated to show the first and second pads 101, 102 as well as electrical connections within the protection device 120 and to the first and second pads 101, 102. For example, the first pad 101 is electrically connected to the second p-type active area 123b and to the second n-type active area 125b, and the second pad 102 is electrically connected to the third p-type active area 123c and to the third n-type active area 125c. Additionally, the first n-type active area 125a is electrically connected to the fourth n-type active area 125d, and the first and fourth p-type active areas 123a, 123d are electrically connected to the first supply voltage $V_1$. The illustrated electrical connections can be made, for example, using contacts and metallization during back-end processing.

The bi-directional bipolar transistor 103 can be formed from the second n-well 124b and the second and third p-wells 122b, 122c. For example the bi-directional bipolar transistor 103 can have an emitter/collector E/C formed from the second p-well 122b, a base formed from the second n-well 124b, and a collector/emitter C/E formed from the third p-well 122c. The first and second NPN bipolar transistors 104, 105 can be formed from the second and third n-type active areas 125b, 125c, from the second and third p-wells 122b, 122c, and from the n-type isolation layer 129, and can be vertical parasitic NPN bipolar devices. For example, the first NPN bipolar transistor 104 can have an emitter formed from the second n-type active area 125b, a base formed from the second p-well 122b, and a collector formed from the n-type isolation layer 129. Additionally, the second NPN bipolar transistor 105 can have an emitter formed from the third n-type active area 125c, a base formed from the third p-well 122c, and a collector formed from the n-type isolation layer 129. The first and second PNP bipolar transistors 106, 107 can be formed from the first to fourth p-wells 122a-122d and the first and third n-wells 124a, 124c, and can be lateral parasitic PNP bipolar devices. For example, the first PNP bipolar transistor 106 can have an emitter formed from the second p-well 122b, a base formed from the first n-well 124a, and a collector formed from the first p-well 122a. Additionally, the second PNP bipolar transistor 107 can have an emitter formed from the third p-well 122c, a base formed from the third n-well 124c, and a collector formed from the fourth p-well 122d.

The first and third resistors 111, 113 can be formed from resistance of the second p-well 122b, and the second and fourth resistors 112, 114 can be formed from resistance of the third p-well 122c. Additionally, the fifth resistor 115 can be formed from resistance between the collector of the first PNP bipolar transistor 106 and the first p-type active area 123a, and the sixth resistor 116 can be formed from resistance between the collector of the second PNP bipolar transistor 107 and the fourth p-type active area 123d.

Persons having ordinary skill in the art will appreciate that the cross section shown in FIG. 7B can correspond to the protection circuit 100 shown in FIG. 6. Although the protection device 120 of FIGS. 7A and 7B illustrates one implementation of the protection circuit 100 of FIG. 6, other implementations are possible.

As shown in FIG. 7B, the first and fourth n-type active areas 125a, 125d, the first to third n-wells 124a-124c, and the n-type isolation layer 129 can be configured to be electrically floating, which can aid in expanding a range of voltages over which the first and second pads 101, 102 can operate.

The second and third p-type active areas 123b, 123c can aid in controlling the trigger voltage of the protection device 120. For example, the second and third p-type active areas 123b, 123c can have a higher doping concentration than the second and third p-wells 122b, 122c, respectively, and thus can be used to control the emitter injection of the bi-directional bipolar transistor 103 and/or base resistance of the first and second NPN bipolar transistors 104, 105. Additionally, in certain implementations, the second and third p-type active areas 123b, 123c can also impact the holding voltage of the protection device 120, such as by changing bipolar transistor gain.

With reference to FIGS. 7A and 7B, the second and third p-type active areas 123b, 123c can serve as hole injection centers and recombination centers for electrons injected into the second and third p-wells 122b, 122c, respectively. By configuring the second p-type active area 123b to include protruding portions 123b2 that extend between island regions 125b1 of the second n-type active area 125b, and by configuring the third p-type active area 123c to include protruding portions 123c2 that extend between island regions 125c1 of the third n-type active area 125c, the operation of the second and third p-type active areas 123b, 123c as hole injection centers and electron recombination centers can be enhanced.

By increasing the injection of holes and recombination of electrons, the operation of the bi-directional bipolar transistor 103 can be enhanced and the operation of the first and second NPN bipolar transistors 104a, 104b can be reduced, which can help increase the holding and trigger voltages of the protection device 120 to a level suitable for use as the tertiary protection device 43a, 43b of FIG. 2. Additionally, forming the second and third n-type active areas 125b, 125c from the island regions 125b1, 125c1, respectively, can increase the resistance into the emitters and reduce the emitter region size of the first and second NPN bipolar transistors 104a, 104b, which can further help control the holding and/or trigger voltages of the protection device 120. Furthermore, the inclusion of the deep p-well regions 126a, 126b can further inhibit the operation of the first and second NPN bipolar transistors 104a, 104b, thereby further increasing the holding and/or trigger voltages of the protection device 120.

With reference back to FIG. 7B, the protection device 120 has been annotated to show various dimensions of the wells, regions, and layers described above. In FIG. 7B, the protection device 120 is symmetrical. Accordingly, although dimensions are described below with respect to the left half of the device, the right half of the device can have the same dimensions. Persons having ordinary skill in the art will appreciate that the teachings herein are also applicable to asymmetric devices. For example, asymmetrical structures can be provided by arranging the wells, active regions, and/or other structures of the device in an asymmetric configuration.

A first spacing $d_1$ between the second p-type active area 123b and the second n-type active area 125b can be selected to be a relatively short distance, such as the minimum spacing permitted by the process technology. Selecting the spacing $d_1$ to be relatively short can improve the operation of the second p-type active area 123b as a recombination center for electrons injected into the second p-well 122b. In certain implementations, the first spacing $d_1$ can be selected to be in the range of about 0 μm (abutting) to about 1.5 μm, for example, about 1 μm. However, other dimensions will be readily determined by one of skill in the art.

A second spacing $d_2$ between an edge of the first n-type active area 125a and an edge of the second p-well 122b can be selected to be sufficiently large to avoid the first PNP bipolar transistor 106 from breaking down between the first n-well 124a and the second p-well 122b during a transient electrical event. Likewise, a third second spacing $d_3$ between an edge of the second p-type active area 123b and an edge of the first n-well 124a can be selected to be sufficiently large to avoid the first PNP bipolar transistor 106 from breaking down between the first n-well 124a and the second p-well 122b during a transient electrical event. In certain implementations, the second spacing $d_2$ can be selected to be in the range of about 1.5 μm to about 3 μm, for example, about 2.75 μm, and the third spacing $d_3$ can be selected to be in the range of about 1.5 μm to about 3 μm, for example, about 2.5 μm. However, other dimensions will be readily determined by one of skill in the art.

A fourth spacing $d_4$ has been used to denote a distance between an edge of the first n-type active area 125a and an edge of the first n-well 124a facing the first p-well 122a. The fourth spacing $d_4$ can be sized to help control the resistance of the fifth resistor 115 and to help prevent breakdown to the substrate 121 during a transient electrical event. In certain implementations, the fourth spacing $d_4$ can be selected to be in the range of about 1.5 μm to about 3 μm, for example, about 2.5 μm. However, other dimensions will be readily determined by one of skill in the art.

A fifth spacing $d_5$ has been used to denote a distance between an edge of the first p-type active area 123a and an edge of the first p-well 122a facing the first n-well 124a. The fifth spacing $d_5$ can be sized to help control the resistance of the fifth resistor 115 and to help prevent breakdown to the substrate 121 during a transient electrical event. In certain implementations, the fifth spacing $d_5$ can be selected to be in the range of about 1.5 μm to about 3 μm, for example, about 2.5 μm. However, other dimensions will be readily determined by one of skill in the art.

A sixth spacing $d_6$ has been used to denote a distance between the first p-well 122a and the first n-well 124a. The sixth spacing $d_6$ can be increased to increase breakdown voltage of the protection device 120 to the substrate 121, which can aid in preventing the device 120 from getting damaged or injecting current into to the substrate 121 when the device is stressed at relatively high signaling conditions. In certain implementations, the sixth spacing $d_6$ can be selected to be in the range of about 0 μm to about 2 μm, for example, about 1 μm. However, other dimensions will be readily determined by one of skill in the art.

A seventh spacing $d_7$ has been used to denote a distance between an edge of the first n-well 124a and an edge of the n-type isolation layer 129. In certain implementations, the seventh spacing $d_7$ can be selected to be in the range of about 0 μm (aligned) to about 2.5 μm, for example, about 2.25 μm. However, other dimensions will be readily determined by one of skill in the art.

An eighth spacing $d_8$ representing the width of the second n-well 104b can be selected based on a desired holding voltage characteristic of the bi-directional bipolar transistor 103. In certain implementations, the eighth spacing $d_8$ can be selected to be in the range of about 8 μm to about 40 μm, for example, about 25 μm. However, other dimensions will be readily determined by one of skill in the art.

A ninth spacing $d_9$ has been used to denote a distance between an edge of the second p-well 122b and an edge of the second shallow n-well 127b can be selected based on a desired holding voltage characteristic of the bi-directional bipolar transistor 103. In certain implementations, the ninth spacing $d_9$ can be selected to be in the range of about 0 μm (abutting) to about 2 μm, for example, about 0.8 μm. However, other dimensions will be readily determined by one of skill in the art.

In one embodiment, the protection device 120 can have a trigger voltage of about +/−(30-60) V and a holding voltage in the range of +/−(20-55) V. The protection device 120 can be suitable to operate in certain implementations of the tertiary protection devices 43a, 43b of FIG. 2.

The n-type and p-type wells used to construct the protection devices can operate as blocking junctions and provide effective resistances that can aid in achieving a target holding voltage. In certain implementations, the n-wells can have peak doping concentrations in the range of about $10^{16}$ donors/cm$^3$ to about $10^{18}$ donors/cm$^3$, for instance, about $7 \times 10^{17}$ donors/cm$^3$ and a junction depth in the range of about 3 um to about 5.5 um, for instance 3.4 um. Additionally, in certain implementations the p-wells can have a peak doping concentration in the range of about $10^{16}$ donors/cm$^3$ to about $10^{18}$ donors/cm$^3$, for instance, about $9 \times 10^{17}$ donors/cm$^3$ and a junction depth in the range of about 3 um to about 5.5 um, for instance about 3.5 um. However, persons having ordinary skill in the art will readily ascertain different doping levels and junction depths.

Figure 8A:
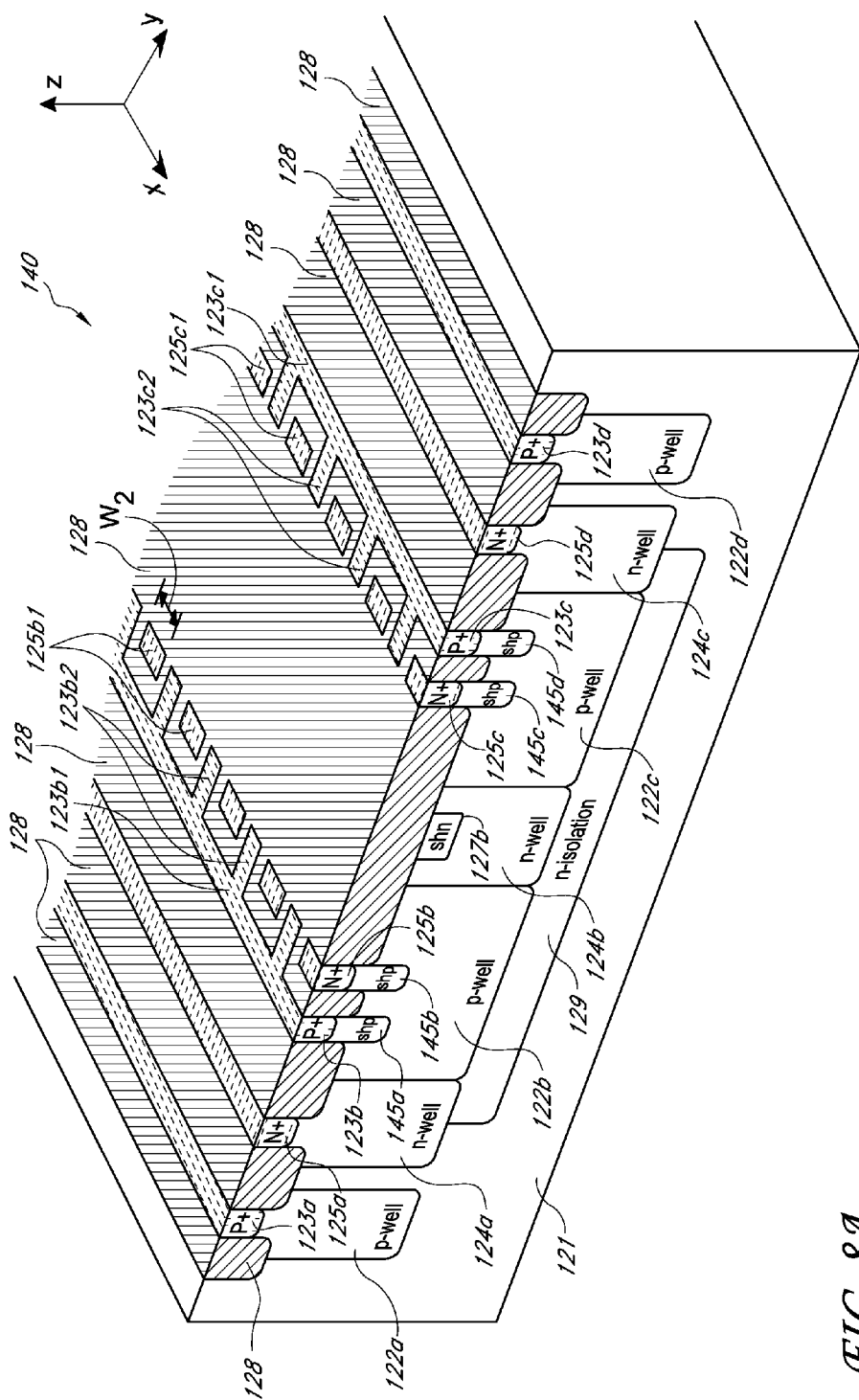
FIG. 8A is a schematic perspective view of a protection device implementing the protection circuit of FIG. 6 according to another embodiment.

FIG. 8A is a schematic perspective view of a protection device 140 implementing the protection circuit 100 of FIG. 6 according to another embodiment. The protection device 140 includes the substrate 121, first to fourth p-wells 122a-122d, first to fourth p-type active areas 123a-123d, first to third n-wells 124a-124c, first to fourth n-type active areas 125a-125d, the second shallow n-well 127b, first to fourth shallow p-wells 145a-145d, the oxide regions 128, and the n-type isolation layer 129. The protection device 140 can be used to operate as the secondary protection devices 42a, 42b of FIG. 2. Furthermore, as will be discussed later below with respect to FIG. 8B, in certain implementations the protection device 140 can be configured to operate as the primary protection devices 41a, 41b of FIG. 2.

The protection device 140 of FIG. 8A can be similar to the protection device 120 of FIGS. 7A-7B. However, in contrast to the protection device 120 of FIGS. 7A-7B that includes the first and third shallow n-wells 127a, 127c and the first and second deep p-wells 126a, 126b, the protection device 140 of FIG. 8A does not include these structures. Rather, these structures have been omitted in favor of including the first shallow p-well 145a beneath the second p-type active area 123b, the second shallow p-well 145b beneath the second n-type active area 123c, the third shallow p-well 145c beneath the third n-type active area 125c, and the fourth shallow p-well 145d beneath the third p-type active area 123c. By configuring the protection device 140 of FIG. 8A in this manner, the gain of the vertical NPN bipolar transistors structures (see, for example, the first and second NPN bipolar transistors 104, 105 of FIG. 7B) can be lowered and the holding voltage of the protection device 140 can be increased further relative to the protection device 120 of FIGS. 7A and 7B. For example, the first to fourth shallow p-wells 145a-145d can help increase the holding voltage of the protection device 140 by lowering the current gain of the first and second NPN bipolar transistors 104, 105 in the protection device 140.

Although FIG. 8A illustrates a configuration in which the first and third shallow n-wells 127a, 127c have been omitted, in certain implementations the protection device 120 can be adapted to include the first and third shallow n-wells 127a, 127c of FIGS. 7A and 7B. For example, the first and third shallow n-wells 127a, 127c can be included in implementations in which a higher doping concentration is desired in the isolation structure formed from the first and third n-wells 124a, 124c. Increasing the doping concentration in the isolation structure can help reduce substrate injection when the protection device 120 is activated.

In one embodiment, the width $W_2$ of the island regions 125b1 is in the range of about 1 μm to about 2.5 μm, for example, about 1.5 μm. However, other implementations are possible. For example, the width $W_2$ can be increased in certain implementations to enhance the action of the NPN bipolar transistors and to lower holding voltage.

Figure 8B:
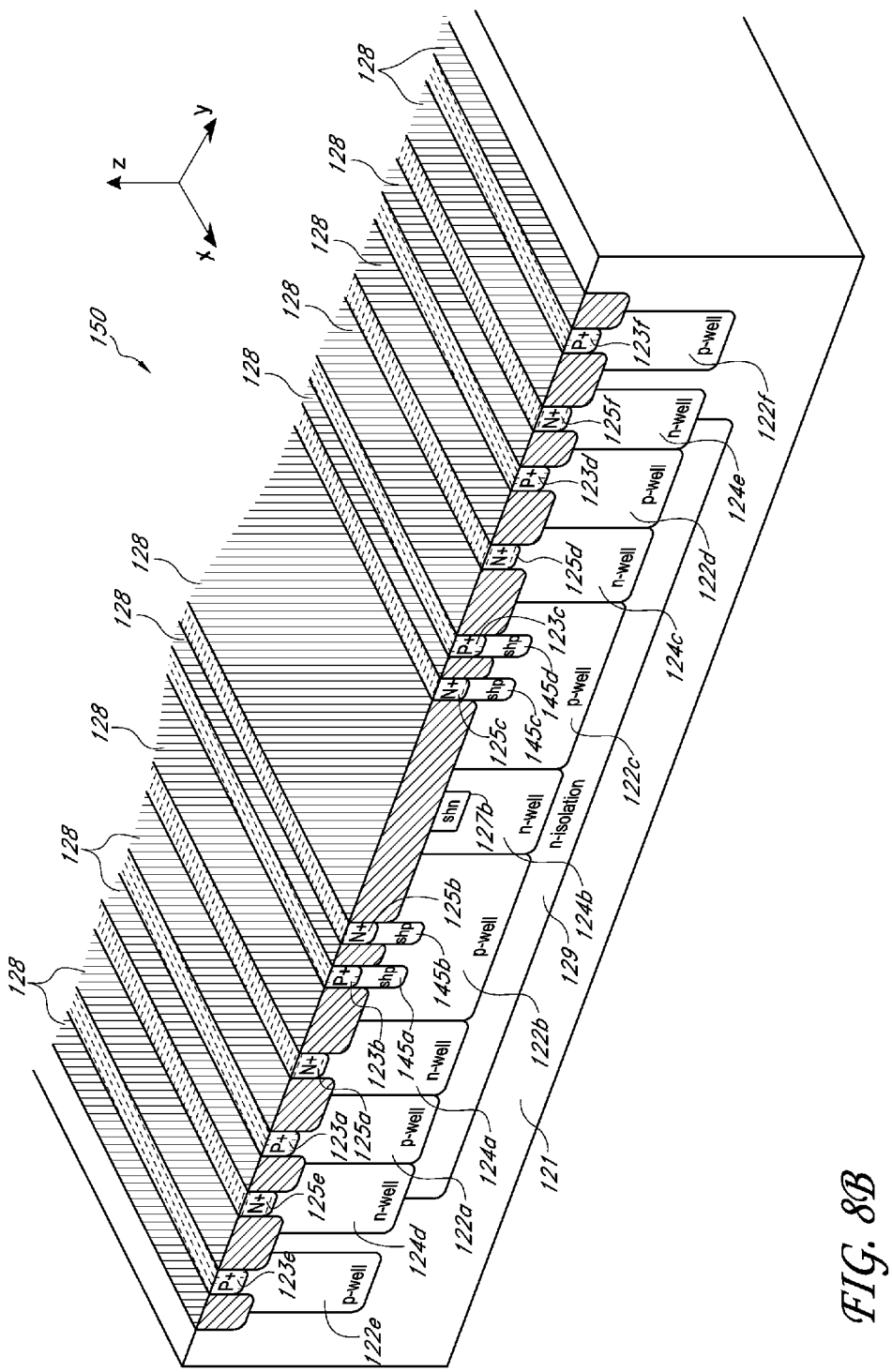
FIG. 8B is a schematic perspective view of a protection device implementing the protection circuit of FIG. 6 according to yet another embodiment.

FIG. 8B is a schematic perspective view of a protection device 150 implementing the protection circuit 100 of FIG. 6 according to another embodiment. The protection device 150 includes the substrate 121, first to sixth p-wells 122a-122f, first to sixth p-type active areas 123a-123f, first to fifth n-wells 124a-124e, first to sixth n-type active areas 125a-125f, the second shallow n-well 127b, first to fourth shallow p-wells 145a-145d, the oxide regions 128, and the n-type isolation layer 129. The protection device 150 illustrates one example of a protection device suitable for use as the primary protection devices 41a-41b of FIG. 2.

The protection device 150 of FIG. 8B can be similar to the protection device 140 described above with reference to FIG. 8A, except that the second and third p-type active areas 123b, 123c and the second and third n-type active areas 125b, 125c have been arranged in a different layout configuration. For example, rather than forming the second and third p-type active areas 123b, 123c from elongated portions 123b1, 123c1 and protruding portions 123b2, 123c2 and the second and third n-type active areas 125b, 125c from island portions 125b1, 125c1, in the protection device 150 of FIG. 8B the second and third p-type active areas 123b, 123c and the second and third n-type active areas 125b, 125c have each been formed from channels extending along the x-direction parallel to one another. Configuring the second and third p-type active areas 123b, 123c and the second and third n-type active areas 125b, 125c in this manner can be used to decrease the trigger and holding voltages of the protection device 150 of FIG. 8B relative to the protection device 140 of FIG. 8A, thereby helping the protection device 150 to have protection characteristics suitable for operating as a primary protection device. In certain implementations, the protection device 150 is configured to have a holding voltage suitable for operation as a primary protection device by controlling the width d8 of FIG. 7B to a value suitable to achieve the target holding voltage.

Furthermore, in contrast to the protection device 140 of FIG. 8A, the protection device 150 of FIG. 8B further includes the fifth and sixth p-wells 122e, 122f, the fifth and sixth p-type active areas 123e, 123f, the fourth and fifth n-wells 124d, 124e, and the fifth and sixth n-type active areas 125e, 125f. As illustrated in FIG. 8B, the fourth n-well 124d is disposed on a side of the first p-well 122a opposite the first n-well 124a, and the fifth n-well 124e is disposed on a side of the fourth p-well 122d opposite the third n-well 124c. Additionally, the fifth p-well 122e is disposed on a side of the fourth n-well 124d opposite the first p-well 122a, and the sixth p-well 122f is disposed on a side of the fifth n-well 124e opposite the fourth p-well 122d. Furthermore, the fifth and sixth p-type active areas 123e, 123f are disposed in the fifth and sixth p-wells 122e, 122f, respectively, and the fifth and sixth n-type active areas 125e, 125f are disposed in the fourth and fifth n-wells 124d, 124e, respectively. In the illustrated configuration, the n-type isolation layer 129 is disposed beneath the first to third n-wells 124a-124c, beneath the second and third p-wells 122b, 122c, and beneath a portion of the fourth and fifth n-wells 124d, 124e. Additionally, the fifth and sixth p-wells 122e, 122f are spaced from the fourth and fifth n-wells 124d, 124e, respectively, such that the fifth p-well 122e does not abut the fourth n-well 124d and such that the sixth p-well 122f does not abut the fifth n-well 124e. However, other implementations are possible.

The fourth and fifth n-wells 124d, 124e and the fifth and sixth n-type active areas 125e, 125f can operate as a first isolation structure for isolating the protection device 150 from the substrate 121, and the fifth and sixth p-wells 122e, 122f and the fifth and sixth p-type active areas 123e, 123f can operate as a second isolation structure for isolating the protection device 150 from the substrate 121. For example, in an annular configuration, the fourth and fifth n-wells 124d, 124e and the fifth and sixth n-type active areas 125e, 125f can operate as a first isolation ring and the fifth and sixth p-wells 122e, 122f and the fifth and sixth p-type active areas 123e, 123f can operate as a second isolation ring. Since the protection device 150 can operate as a primary protection device configured to handle a relatively large current, including one or more isolation rings can help reduce the amount of charge injected into the substrate 121, thereby helping to prevent latch-up.

Although the protection device 150 of FIG. 8B is illustrated as including the fourth and fifth n-wells 124d, 124e, the fifth and sixth n-type active areas 125e, 125f, the fifth and sixth p-wells 122e, 122f, and the fifth and sixth p-type active areas 123e, 123f, and the protection device 140 of FIG. 8A is illustrated as not including these structures, in certain implementations the protection device 140 of FIG. 8A can be adapted to include these structures. For example, the protection device 140 of FIG. 8A can include these structures to help reduce the amount of charge that is injected into the substrate 141 during a transient electrical event.

FIG. 9A is a schematic top plan view of a protection device 160 according to one embodiment. The protection device 160 illustrates one example of a protection device suitable for use as the primary protection devices 41a, 41b of FIG. 2. However, the protection device 160 can also be configured to operate as other protection devices, such as secondary protection devices. The protection device 160 includes first to fourth pads 161a-161d, first to sixth p-wells 162a-162f, first and second n-wells 164a, 164b, and the n-type isolation layer 169. Although only certain structures of the protection device 160 have been illustrated in FIG. 9A, the protection device 160 can include other structures, such as contacts and metallization, oxide regions, active areas, shallow wells, and/or deep wells. Skilled artisans will appreciate that these details have been omitted from FIG. 9A for clarity.

As shown in FIG. 9A, the second to fifth p-wells 162b-162e have been disposed as non-abutting islands in the first n-well 164a. The first pad 161a has been formed over the second p-well 162b, the second pad 161b has been formed over the third p-well 162c, the third pad 161c has been formed over the fourth p-well 162d, and the fourth pad 161d has been formed over the fifth p-well 162e. Additionally, the second p-well 162a has been configured as a first ring that surrounds and abuts the first n-well 164a. Furthermore, the second n-well 164b has been configured as a second ring that surrounds and abuts the first p-well 162a. Additionally, the sixth p-well 162f has been configured as a third ring that surrounds, but does not abut, the first p-well 162a. The n-type isolation layer 169 has been disposed beneath the first n-well 164a, the first to fifth p-wells 162a-162e, and beneath a portion of the second n-well 164b. Although FIG. 9A illustrates one specific configuration of a protection device, other implementations are possible, such as annular and circular layout arrays to adapt the device configuration to chip-level layout, bonding and packaging constraints.

The protection device 160 can be configured to provide protection by connecting the protection device to the first to fourth pads 161a-161d. For example, in one implementation, the first and third pads 161a, 161c are power-low pads and the second and fourth pads 161b, 161d are power-high pads, and the protection device 160 is used to provide protection from overvoltage and undervoltage conditions received between the power-high and power low pads. Although FIG. 9A illustrates an implementation in which the protection device 160 is configured to protect four pads, the protection device 160 can be configured to protect more or fewer pads. In certain implementations, the first and third pads 161a, 161c are connected to a common power-low pad and the second and fourth pads 161b, 161d are connected to a common power-high pad.

The protection device 160 of FIG. 9A illustrates one example of an annular implementation of the protection device 150 of FIG. 8B. For example, the first n-well 164a of FIG. 9A can correspond to the first to third n-wells 124a-124c of FIG. 8B, and the second n-well 164b of FIG. 9A can correspond to the fourth and fifth n-wells 124d, 124e of FIG. 8B. Additionally, the first p-well 162a of FIG. 9A can correspond to the first and fourth p-wells 122a, 122d of FIG. 8B, the second and fourth p-wells 162b, 162d of FIG. 9A can correspond to the second p-well 122b of FIG. 8B, the third and fifth p-wells 162c, 162e of FIG. 9A can correspond to the third p-well 122c of FIG. 8B, and the sixth p-well 162f of FIG. 9A can correspond to the fifth and sixth p-wells 122e, 122f of FIG. 8B. Furthermore, the n-type isolation layer 169 of FIG. 9A can correspond to the n-type isolation layer 129 of FIG. 8B.

As described above, the correspondence between structures of the protection device 160 of FIG. 9A and the protection device 150 of FIG. 8B need not be one-to-one. For example the second n-well 164b of FIG. 9A can be a ring that surrounds the first p-well 162a, and thus can operate as both the fourth and fifth n-wells 122d, 122e of FIG. 8B. Configuring one or more wells as rings can help improve the current handling capability of the device and/or reduce the footprint of the device. Additionally, certain structures of the protection device 160 of FIG. 9A can be implemented as sub-structures that are electrically connected to one another to form a corresponding structure in the protection device 150 of FIG. 8B. For example, the second and fourth p-wells 162b, 162d of FIG. 9A can be electrically connected to one another to collectively operate as the second p-well 122b of FIG. 8B. Implementing certain wells using sub-structures that are electrically connected in parallel can help control the size and/or electrical characteristics of a protection device. Persons having ordinary skill in the art will appreciate that many configurations are possible, and that FIG. 9A illustrates one of many possible implementations.

In one embodiment, the footprint of the protection device 160 has a width WDx1 in the range of about 200 µm to about 300 µm, for example, about 250 µm, and the protection device 160 has a length WDy1 in the range of about 180 µm to about 300 µm, for example, about 230 µm. Additionally, the finger width Wfx1 is in the range of about 120 µm to about 250 µm, for example, about 150 µm, and the finger length Lfy1 is in the range of about 2 µm to about 8 µm, for example, about 5 µm. However, other dimensions will be readily determined by one of skill in the art.

FIG. 9B is an enlarged partial top plan view of one implementation of the protection device 160 of FIG. 9A. The plan view shows a portion of the protection device 160 within the box 9B of FIG. 9A. The illustrated portion of the protection device includes the first n-well 164a and the second and third p-wells 162b, 162c of FIG. 9A. Additionally, the portion of the protection device has been annotated to show the second p-type active area 123b and the second n-type active area 125b in the second p-well 162b, and the third p-type active areas 123c and the third n-type active area 125c in the third p-well 162c. Additional details of the second and third p-type active areas 123b, 123c and the second and third n-type active areas 125b, 125c can be as described above with reference to FIG. 8B.

Although FIG. 9B shows one implementation of a portion of the protection device 160 of FIG. 9A, the protection device 160 can be arranged in other ways. For example, in one embodiment, the portion of the protection device 160 within the box 9B of FIG. 9A is similar to the portion of the protection device shown in FIG. 10B, which will be described in detail further below.

Figure 10B:
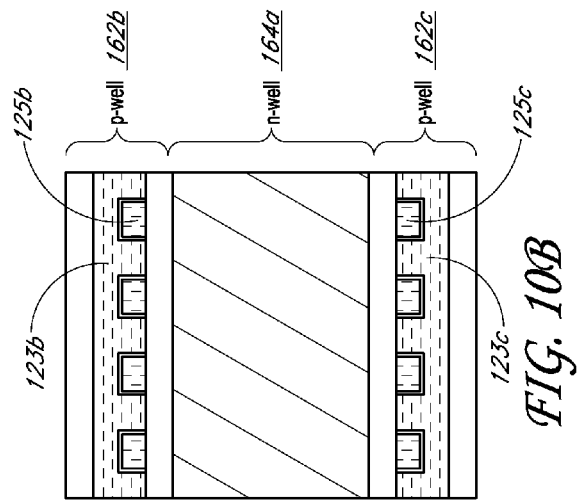
FIG. 10B is an enlarged partial top plan layout view of one implementation of the protection device of FIG. 10A.
Figure 10A:
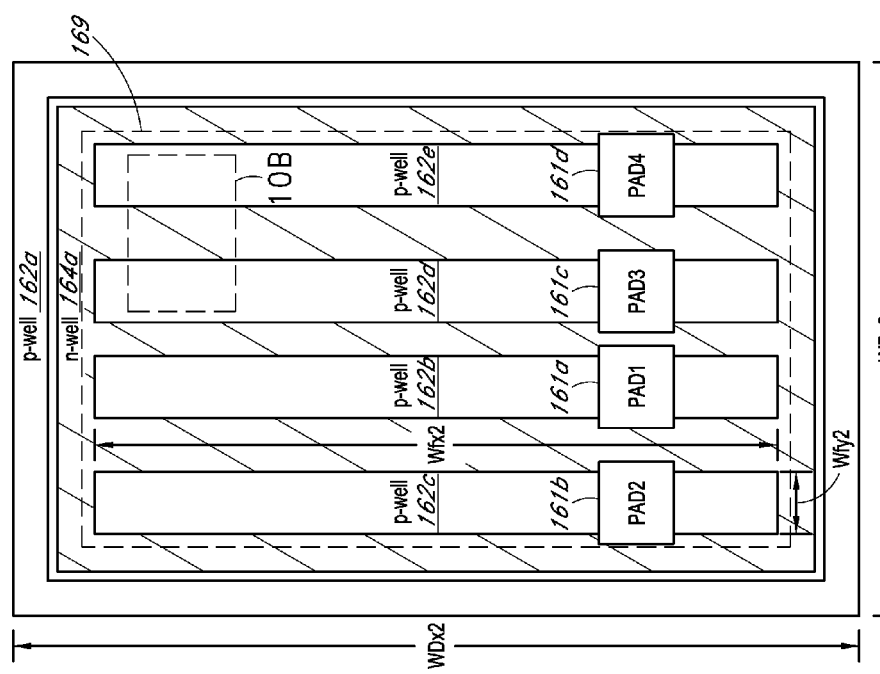
FIG. 10A is a schematic top plan layout view of a protection device according to another embodiment.

FIG. 10A is a schematic top plan layout view of a protection device 180 according to another embodiment. The protection device 180 illustrates one example of a protection device suitable for use as the secondary protection devices 42a, 42b of FIG. 2. However, the protection device 180 can also be configured to operate as other protection devices, such as tertiary protection devices. The protection device 180 includes the first to fourth pads 161a-161d, the first to fifth p-wells 162a-162e, the first n-well 164a, and the n-type isolation layer 169. Although only certain structures of the protection device 180 have been illustrated in FIG. 10A, the protection device 180 can include other structures, such as contacts and metallization, oxide regions, active areas, shallow wells, and/or deep wells.

The protection device 180 of FIG. 10A is similar to the protection device 160 of FIG. 9A, except that the protection device 180 of FIG. 10A does not include the second n-well 164b and the sixth p-well 162f. Additionally, in the illustrated configuration, the n-type isolation layer 129 is disposed beneath the second to fifth p-wells 162b-162e and beneath a portion of the first n-well 164a.

The protection device 180 of FIG. 10A illustrates one example of a layout implementation of the protection device 140 of FIG. 8A. For example, the first n-well 164a of FIG. 10A can correspond to the first to third n-wells 124a-124c of FIG. 8A, the first p-well 162a of FIG. 10A can correspond to the first and fourth p-wells 122a, 122d of FIG. 8A, the second and fourth p-wells 162b, 162d of FIG. 10A can correspond to the second p-well 122b of FIG. 8A, the third and fifth p-wells 162c, 162e of FIG. 10A can correspond to the third p-well 122c of FIG. 8A, and the n-type isolation layer 169 of FIG. 10A can correspond to the n-type isolation layer 129 of FIG. 8A.

In one embodiment in which the protection device 180 is configured to operate as a secondary protection device, the footprint of the protection device 180 has a width WDx2 in the range of about 180 µm to about 250 µm, for example, about 200 µm, and the protection device 160 has a length WDy2 in the range of about 130 µm to about 200 µm, for example, about 160 µm. In certain implementations, the finger width Wfx2 is in the range of about 120 µm to about 250 µm, for example, about 150 µm, and the finger length Lfy2 is in the range of about 1.2 µm to about 4 µm, for example, about 1.8 µm. However, other dimensions will be readily determined by one of skill in the art.

In another embodiment in which the protection device 180 is configured to operate as a tertiary protection device, the footprint of the protection device 180 has a width WDx2 in the range of about 60 µm to about 140 µm, for example, about 90 µm, and the protection device 160 has a length WDy2 in the range of about 110 µm to about 160 µm, for example, about 120 µm. Additionally, the finger width Wfx2 is in the range of about 50 µm to about 100 µm, for example, about 75 µm, and the finger length Lfy2 is in the range of about 1.1 µm to about 2 µm, for example, about 1.2 µm. However, other dimensions will be readily determined by one of skill in the art.

FIG. 10B is an enlarged partial top plan view of one implementation of the protection device 180 of FIG. 10A. The plan view shows a portion of the protection device 180 within the box 10B of FIG. 10A. The illustrated portion of the protection device includes the first n-well 164a and the second and third p-wells 162b, 162c of FIG. 10A. Additionally, the portion of the protection device has been annotated to show the second p-type active area 123b and the second n-type active area 125b in the second p-well 162b, and the third p-type active areas 123c and the third n-type active area 125c in the third p-well 162c. Additional details of the second and third p-type active areas 123b, 123c and the second and third n-type active areas 125b, 125c can be as described above with reference to FIG. 8A.

Although FIG. 10B shows one implementation of a portion of the protection device 180 of FIG. 10A, the protection device 180 can be arranged in other ways. For example, in one embodiment, the portion of the protection device 180 within the box 10B of FIG. 10A is similar to the portion of the protection device shown in FIG. 9B.

In the embodiments described above, the protections devices can include layers, regions, and/or wells having n-type or p-type dopants. In other embodiments, the doping types of all the layers, regions, and wells of the protection devices can be opposite to those described and shown in the above embodiments, and the same principles and advantages can still apply to the other embodiments. For example, a complementary version of the protection devices of FIGS. 7A-9C can be formed using an n-type substrate or using a p-type substrate having an n-type epitaxial layer formed thereon. In such embodiments, the n-type isolation layer 129 is replaced with a p-type isolation layer, and the n-wells and p-wells of the protection device can be replaced with p-wells and n-wells, respectively. Additionally, the n-type active regions and the p-type active regions can be replaced with p-type active regions and n-type active regions, respectively.

Applications

Devices employing the above described schemes can be implemented into various high performance electronic devices and interface applications operating in harsh electrical environments. Examples of the electronic devices can include, but are not limited to, consumer electronic products, parts of the consumer electronic products, electronic test equipment, high robustness industrial and automotive applications, etc. Examples of the electronic devices can also include circuits of optical networks or other communication networks. The consumer electronic products can include, but are not limited to, an automobile, a vehicle engine management controller, a transmission controller, a seatbelt controller, an anti-lock brake system controller, a camcorder, a camera, a digital camera, a portable memory chip, a washer, a dryer, a washer/dryer, a copier, a facsimile machine, a scanner, a multi functional peripheral device, etc. Further, the electronic device can include unfinished products, including those for industrial, medical and automotive applications.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An apparatus comprising:
   a first pad;
   an internal circuit electrically connected to the first pad; and
   a protection system configured to protect the internal circuit from transient electrical events, the protection system comprising:
      a first primary protection device electrically connected to the first pad and configured to have a first holding voltage and to provide bi-directional blocking voltage protection; and
      a first secondary protection device electrically connected to the first pad and configured to have a second holding voltage and to provide bi-directional blocking voltage protection, wherein the first primary protection device has a current handling capability greater than a current handling capability of the first secondary protection device, and wherein the first secondary protection device is smaller than the first primary protection device and has a turn-on speed that is faster than a turn-on speed of the first primary protection device, and wherein a magnitude of the first holding voltage is less than a magnitude of the second holding voltage such that when the first primary protection device has been activated the activated first primary protection device clamps a voltage of the first pad and decreases a flow of current through the first secondary protection device.

2. The apparatus of claim 1, wherein the internal circuit includes a high voltage double-diffused metal oxide semiconductor (DMOS) transistor in series with a resistor and a blocking junction, wherein the resistor and the blocking junction each include a plurality of segments and the DMOS transistor includes a plurality of fingers, where each of the plurality of segments of the resistor and the blocking junction is electrically connected independently in series with a corresponding one of the plurality of fingers to provide independent finger ballasting.

3. The apparatus of claim 1, wherein the protection system further comprises:
   a first tertiary protection device electrically connected to the first pad and configured to have a third holding voltage and to provide bi-directional blocking voltage protection;
   wherein the current handling capability of the first secondary protection device is greater than a current handling capability of the first tertiary protection device, and wherein the first tertiary protection device has a turn-on speed that is faster than the turn-on speed of the first primary protection device, and wherein the magnitude of the first holding voltage is less than a magnitude of the third holding voltage such that when the first primary protection device has been activated the activated first primary protection device clamps the voltage of the first pad so as to decrease a flow of current through the tertiary protection device.

4. The apparatus of claim 3, wherein primary protection is optimized to provide system-level electrostatic discharge (ESD) and system-level electromagnetic interference (EMI) robustness by providing discharge path from the first pad to a power-low pad.

5. The apparatus of claim 1, wherein the first pad is a signal pad, and wherein the apparatus further comprises a power-low pad and a power-high pad, wherein the first primary protection device is electrically connected between the signal pad and the power-low pad, and the first secondary protection device is electrically connected between the signal pad and the power-high pad.

6. The apparatus of claim 5, further comprising a second primary protection device electrically connected between the power-high pad and the power-low pad.

7. The apparatus of claim 6, further comprising a first capacitor electrically connected between the signal pad and the power-low pad, and a second capacitor electrically connected between the power-high pad and the power-low pad.

8. The apparatus of claim 5, further comprising a resistor electrically connected between an output of the internal circuit and the first pad, wherein the resistor has a resistance selected to be in the range of about $0.5\Omega$ to about $1\ k\Omega$.

9. The apparatus of claim 5, further comprising a voltage regulator and a second secondary protection circuit, wherein the voltage regulator is configured to generate a regulated voltage supply for the internal circuit, and wherein the second secondary protection circuit is electrically connected between the power-high pad and the regulated voltage supply.

10. The apparatus of claim 1, wherein the first primary protection device includes a first bi-directional bipolar transistor and the first secondary protection device includes a second bi-directional bipolar transistor, wherein the first bi-directional bipolar transistor is configured to control the first holding voltage and the second bi-directional bipolar transistor is configured to control the second holding voltage, and wherein the first and second bi-directional bipolar transistors are each configured to provide dual polarity blocking voltage protection.

11. The apparatus of claim 1, wherein the first primary protection device and the first secondary protection device are configured to provide asymmetric bi-directional blocking voltage protection.

12. An apparatus comprising:
   a pad;
   an internal circuit electrically connected to the pad; and
   a protection system configured to protect the internal circuit from transient electrical events, the protection system comprising:
      a means for providing primary bi-directional blocking voltage protection electrically connected to the pad and configured to have a first holding voltage; and
      a means for providing secondary bi-directional blocking voltage protection electrically connected to the pad and configured to have a second holding voltage, wherein the primary protection means has a current handling capability greater than a current handling capability of the secondary protection means, and wherein the secondary protection means has a turn-on speed that is faster than a turn-on speed of the primary protection means, and wherein a magnitude of the first holding voltage is less than a magnitude of the second holding voltage such that when the primary bi-directional blocking voltage protection means has been activated the activated primary protection means clamps a voltage of the pad so as to decrease a flow of current through the secondary protection means.

13. An apparatus comprising:
a substrate;
a pad;
a primary protection device electrically connected to the pad and configured to have a first holding voltage, wherein the primary protection device includes a first bi-directional bipolar transistor disposed in the substrate; and
a secondary protection device electrically connected to the pad and configured to have a second holding voltage, wherein the secondary protection device includes a second bi-directional bipolar transistor disposed in the substrate,
wherein the primary protection device has a current handling capability greater than a current handling capability of the secondary protection device, and wherein the secondary protection device has a turn-on speed that is faster than a turn-on speed of the primary protection device, and wherein a magnitude of the first holding voltage is less than a magnitude of the second holding voltage such that when the primary protection device has been activated the activated primary protection device clamps a voltage of the pad so as to decrease a flow of current through the secondary protection device.

14. The apparatus of claim 13, further comprising:
a first central well disposed in the substrate, wherein the first central well has a doping of a first type;
a first well disposed in the substrate adjacent to the first central well, wherein the first well has a doping of a second type opposite to the first type; and
a second well disposed in the substrate adjacent to the first central well, wherein the first central well from is between the first well and the second well, wherein the second well has a doping of the second type, wherein the first central well, the first well, and the second well are configured to operate as the first bi-directional bipolar transistor.

15. The apparatus of claim 14, further comprising a shallow well having a doping of the second type formed in the first central well.

16. The apparatus of claim 14, further comprising a first annular ring having a doping of the second type and an isolation layer having a doping of the second type, wherein the first annular ring surrounds the first central well, the first well, and the second well, and wherein the isolation layer is disposed beneath the first central well, the first well, the second well and at least a portion of the first annular ring, and wherein the first annular ring and the isolation layer are electrically floating.

17. The apparatus of claim 16, further comprising a second annular ring having a doping of the first type and a third annular ring having a doping of the second type, wherein the second annular ring is configured to surround the first annular ring, and wherein the third annular ring is configured to surround the second annular ring, and wherein the isolation layer is configured to extend beneath at least a portion of the second annular ring.

18. The apparatus of claim 14, further comprising:
a first active region and a second active region disposed in the first well, the second active region having a portion farther from the first central well than at least a portion of the first active region, the first active region having a doping of the first type, the second active region having a doping of the second type; and
a third active region and a fourth active region disposed in the second well, the fourth active region having a portion farther from the first central well than at least a portion of the third active region, the third active region having a doping of the first type, the fourth active region having a doping of the second type.

19. The apparatus of claim 18, wherein the first, second, third, and fourth active regions comprise a plurality of channels generally aligned in a direction.

20. The apparatus of claim 18, further comprising shallow well regions each having a doping of the first type, the shallow well regions beneath the first, second, third and fourth active regions.

21. The apparatus of claim 14, wherein the first type is p-type, and the second type is n-type.

22. The apparatus of claim 14, further comprising:
a second central well disposed in the substrate, wherein the second central well has a doping of the first type;
a third well disposed in the substrate adjacent to the second central well, wherein the third well has a doping of the second type; and
a fourth well disposed in the substrate adjacent to the second central well, wherein the second central well is between the third well and the fourth well, wherein the fourth well has a doping of the second type, wherein the second central well, the third well, and the fourth well are configured to operate as the second bi-directional bipolar transistor.

23. The apparatus of claim 22, further comprising:
a first active region and a second active region disposed in the third well, the second active region having a portion farther from the second central well than at least a portion of the first active region, the first active region having a doping of the first type, the second active region having a doping of the second type; and
a third active region and a fourth active region disposed in the fourth well, the fourth active region having a portion farther from the second central well than at least a portion of the third active region, the third active region having a doping of the first type, the fourth active region having a doping of the second type.

24. The apparatus of claim 23, wherein the first active region comprises a plurality of first separated regions generally aligned in a direction;
wherein the portion of the second active region forms a first elongated portion extending in the direction such that the plurality of first separated regions are interposed between the first elongated portion and the second central well when viewed from above;
wherein the third active region comprises a plurality of second separated regions generally aligned in the direction; and
wherein the portion of the fourth active region forms a second elongated portion extending in the direction such that the plurality of second separated regions are interposed between the second elongated portion and the second central well when viewed from above.

* * * * *

UNITED STATES PATENT AND TRADEMARK OFFICE
CERTIFICATE OF CORRECTION

Page 1 of 1

PATENT NO.        : 8,947,841 B2
APPLICATION NO.   : 13/372327
DATED             : February 3, 2015
INVENTOR(S)       : Javier A. Salcedo It is certified that error appears in the above-identified patent and that said Letters Patent is hereby corrected as shown below:

In the specification

In column 26 at line 11, Change "power low" to --power-low--.

In the claims

In column 31 at line 45, In Claim 14, after "well" delete "from".

In column 31 at line 60, In Claim 16, change "well" to --well,--.

Signed and Sealed this
Twenty-fourth Day of November, 2015

Michelle K. Lee
*Director of the United States Patent and Trademark Office*